US012080658B2

(12) United States Patent
Chen et al.

(10) Patent No.: US 12,080,658 B2
(45) Date of Patent: Sep. 3, 2024

(54) INTEGRATED CIRCUIT DEVICE WITH ANTENNA EFFECT PROTECTION CIRCUIT AND METHOD OF MANUFACTURING

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: CunCun Chen, Hsinchu (TW); XinYong Wang, Hsinchu (TW); Yaqi Ma, Hsinchu (TW); Lei Pan, Hsinchu (TW); MingJian Wang, Hsinchu (TW); JiaLiang Zhong, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 317 days.

(21) Appl. No.: 17/522,376

(22) Filed: Nov. 9, 2021

(65) Prior Publication Data
US 2023/0088282 A1 Mar. 23, 2023

(30) Foreign Application Priority Data
Sep. 18, 2021 (CN) .......................... 202111109795.6

(51) Int. Cl.
*H01L 23/60* (2006.01)
*H01L 21/768* (2006.01)
*H01L 21/8238* (2006.01)
*H01L 23/48* (2006.01)
(Continued)

(52) U.S. Cl.
CPC ........ *H01L 23/60* (2013.01); *H01L 21/76898* (2013.01); *H01L 21/823871* (2013.01); *H01L 23/481* (2013.01); *H01L 23/528* (2013.01); *H01L 27/092* (2013.01)

(58) Field of Classification Search
CPC ............... H01L 23/60; H01L 21/76898; H01L 21/823871; H01L 23/481; H01L 23/528; H01L 27/092
See application file for complete search history.

(56) References Cited

U.S. PATENT DOCUMENTS 5,610,426 A * 3/1997 Asai .................... H01L 27/0251
257/355
7,260,442 B2 8/2007 Hwang et al.
9,256,709 B2 2/2016 Yu et al.
(Continued)

FOREIGN PATENT DOCUMENTS

TW 430864 4/2001

*Primary Examiner* — Herve-Louis Y Assouman
(74) *Attorney, Agent, or Firm* — Hauptman Ham, LLP

(57) ABSTRACT

An integrated circuit (IC) device includes a first substrate, a through substrate via (TSV) in the first substrate, and a first antenna effect protection circuit over the first substrate and electrically coupled to the TSV. The first antenna effect protection circuit includes at least one first transistor of a first type, and at least one second transistor of a second type different from the first type. A gate terminal, a first terminal and a second terminal of each of the at least one first transistor and the at least one second transistor are electrically coupled together, and to the TSV.

20 Claims, 21 Drawing Sheets

(51) Int. Cl.
*H01L 23/528* (2006.01)
*H01L 27/092* (2006.01)

(56) References Cited

U.S. PATENT DOCUMENTS

| | | |
|---|---|---|
| 2002/0130368 A1 | 9/2002 | Tan |
| 2008/0017906 A1* | 1/2008 | Pelella ................ H01L 27/0255 |
| | | 257/373 |
| 2014/0040838 A1 | 2/2014 | Liu et al. |
| 2015/0278429 A1 | 10/2015 | Chang |
| 2015/0318273 A1 | 11/2015 | Lue et al. |
| 2020/0168595 A1 | 5/2020 | Chang et al. |

* cited by examiner

INTEGRATED CIRCUIT DEVICE WITH ANTENNA EFFECT PROTECTION CIRCUIT AND METHOD OF MANUFACTURING

BACKGROUND

An integrated circuit ("IC") device includes one or more semiconductor devices represented in an IC layout diagram (also referred to as a "layout diagram"). A layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
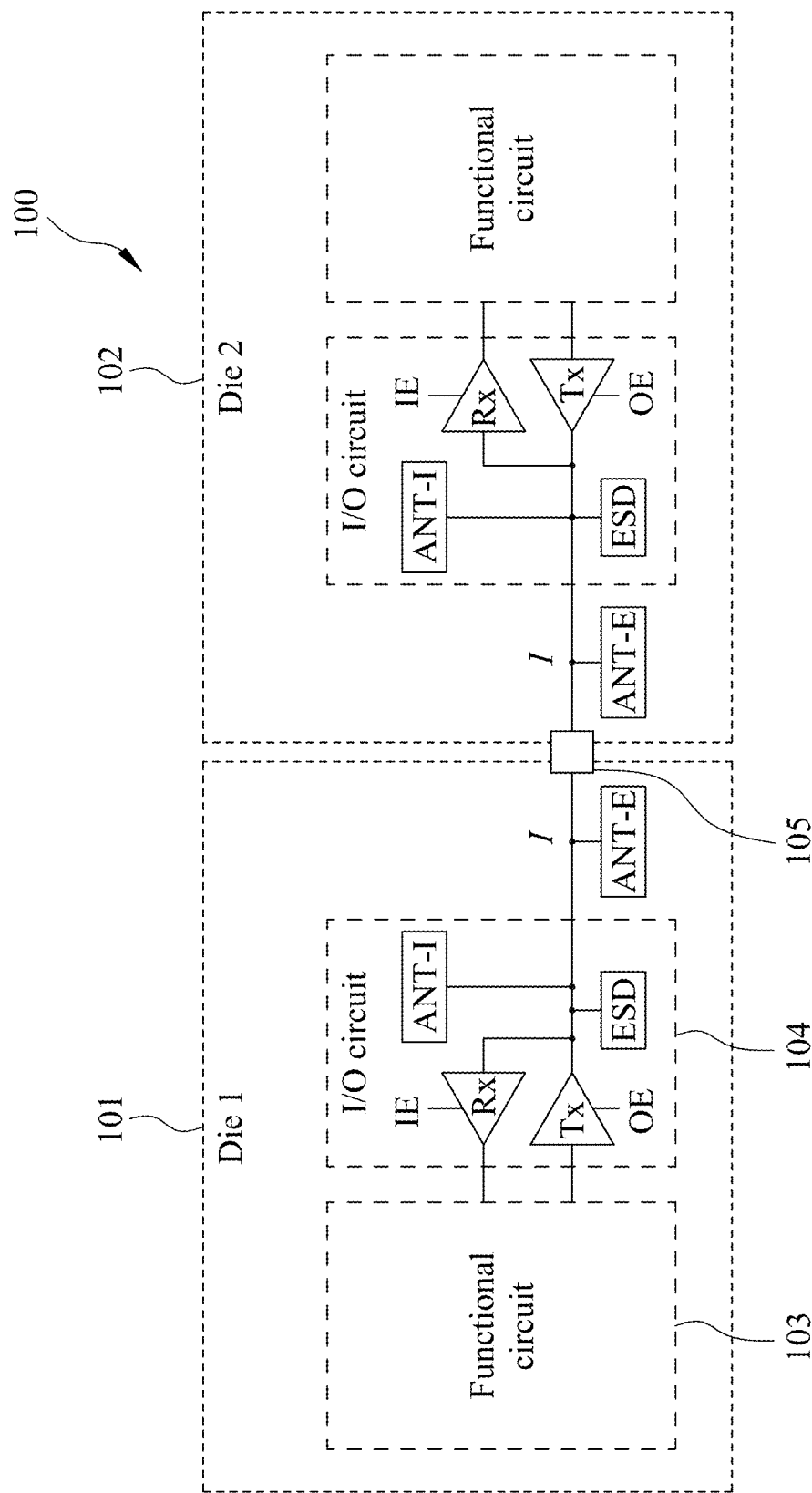
FIG. 1 is a schematic block diagram of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a manufacturing process of an IC device, transistors are formed over a substrate. Each of the transistors comprises a gate electrode, and a gate dielectric between the gate electrode and the substrate. The gate dielectric is an oxide or another gate dielectric material. In manufacturing operations subsequent to the formation of transistors, various dielectric and metal layers are deposited and patterned to obtain conductive vias and/or patterns electrically coupled to the gate electrodes of the transistors. Deposition and/or patterning operations often include plasma operations, such as plasma etching operations, plasma deposition operations, or the like. In plasma operations, it is possible that a sufficient amount of electrical charges is accumulated on a conductive pattern or via coupled to a gate electrode, and causes breakdown of the underlying gate dielectric material and damage to the corresponding transistor. This issue is referred to as "plasma induced gate oxide damage" or "antenna effect." The antenna effect is also a concern in processes of forming a Through Substrate Via (TSV) through a substrate of an IC device for, e.g., three-dimensional (3D) integration of the IC device in a 3D IC. Antenna effect protection circuits are included in IC devices to protect other transistors from being damaged due to the antenna effect during manufacture.

In some embodiments, an antenna effect protection circuit in an IC device comprises at least one transistor of a first type, e.g., a P-type or an N-type, and at least one transistor of a second type, e.g., the N-type or the P-type. The gate, source and drain of each of the transistors are electrically coupled together. As a result, the transistors are electrically coupled as dummy transistors and do not affect operation or functionality of the IC device after the manufacturing process. The P-type and N-type transistors of the antenna effect protection circuit form, together with a substrate of the IC device, corresponding diode structures that protect other, functional transistors from being damaged due to the antenna effect during the manufacturing process of the IC device. This is a difference from other approaches in which transistors of only one type, e.g., N-type transistors, are configured to provide antenna effect protection, whereas transistors of the other type, e.g., P-type transistors, are not configured to provide antenna effect protection. In accordance with some embodiments, by using both P-type and N-type transistors to provide antenna effect protection (also referred to herein as "antenna function" or "antenna usage"), it is possible to achieve one or more advantages including, but not limited to, improved chip area efficiency, reduced routing efforts by an Automated Placement and Routing (APR) tool, or the like.

FIG. 1 is a schematic block diagram of an IC device 100, in accordance with some embodiments.

The IC device 100 comprises a first die 101 (labelled in the drawing as "Die 1") and a second die 102 (labelled in the drawing as "Die 2") electrically and/or physically coupled to each other. In some embodiments, the first die 101 and the second die 102 are stacked over each other, and are physically bonded and electrically coupled to each other in a 3D IC. In some embodiments, the first die 101 and the second die 102 are arranged side-by-side on and physically bonded to a further substrate or die (not shown), and are electrically coupled to each other through the further substrate or die. In some embodiments, the IC device 100 comprises more than two dies electrically and/or physically coupled to each other. In some embodiments, the IC device 100 has one die, e.g., the first die 101, whereas the other die, e.g., the second die 102, is omitted. In the example configuration in FIG. 1, the second die 102 is configured similarly to the first die 101. The first die 101 is described in detail herein, and a detailed description of the second die 102 is omitted.

The first die 101 comprises one or more functional circuits and one or more input/output (I/O) circuits electrically coupled to the one or more functional circuits. In FIG. 1, a representative functional circuit 103 and a representative I/O circuit 104 of the first die 101 are illustrated.

The functional circuit 103 is configured to perform an intended function, e.g., data processing or data storage, of the IC device 100. Examples of one or more circuits, logics, or cells included in the functional circuit 103 include, but are not limited to, AND, OR, NAND, NOR, XOR, INV, OR-AND-Invert (OAI), MUX, Flip-flop, BUFF, Latch, delay, clock, memory, or the like. The circuits, logics, or cells included in the functional circuit 103 include functional transistors or core transistors which are to be protected from the antenna effect during the manufacture of the IC device 100. Examples of transistors in the functional circuit 103, as well as in the other circuits described herein, include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

The I/O circuit 104 is electrically coupled to the functional circuit 103, and is configured as an interface between the functional circuit 103 on the first die 101 and external circuitry outside the first die 101. In the example configuration in FIG. 1, the I/O circuit 104 comprises a receiving circuit Rx (also referred to as "input circuit"), a transferring circuit Tx (also referred to as "output circuit"), an electrostatic discharge (ESD) protection circuit and an antenna effect protection circuit ANT-I, all of which are electrically coupled to a pad or pin I which is an I/O pin. The first die 101 comprises a further antenna effect protection circuit ANT-E, which is outside the I/O circuit 104 and also electrically coupled to the pin I.

The receiving circuit Rx is configured to send a signal on the pin I to the functional circuit 103. The receiving circuit Rx is configured to receive an input enable signal IE. The receiving circuit Rx is enabled to send the signal on the pin I to the functional circuit 103 in response to a logic state of the input enable signal IE, and is disabled from sending the signal on the pin I to the functional circuit 103 in response to a different logic state of the input enable signal IE. The transferring circuit Tx is configured to send a signal output by the functional circuit 103 to the pin I. The transferring circuit Tx is configured to receive an output enable signal OE. The transferring circuit Tx is enabled to send the signal output by the functional circuit 103 to the pin I in response to a logic state of the output enable signal OE, and is disabled from sending the signal output by the functional circuit 103 to the pin I in response to a different logic state of the output enable signal OE. Examples of the signal(s) input from or output to the pin I include, but are not limited to, data, power, clock, control, or the like. Examples of one or more circuits in at least one of the receiving circuit Rx or transferring circuit Tx include, but are not limited to, a buffer, a latch, a level shifter, or the like.

The ESD protection circuit is configured to protect the other circuits, including the functional circuit 103, that are electrically coupled to the pin I from ESD events occurring on the pin I during operation or handling of the first die 101 or IC device 100. Examples of the ESD protection circuit include, but are not limited to, a diode, a grounded-gate NMOS (ggNMOS), a silicon-controlled rectifier (SCR), or the like. In some embodiments, transistors in the ESD protection circuit are larger than and/or have a different configuration from the functional transistors or core transistors of the functional circuit 103 to be able to sustain and handle high voltages and/or current of ESD events.

The antenna effect protection circuit ANT-I is internal to the I/O circuit 104, and the antenna effect protection circuit ANT-E is external to the I/O circuit 104. The antenna effect protection circuits ANT-I, ANT-E are configured to protect transistors of the functional circuit 103 from being damaged due to the antenna effect during the manufacture of the first die 101 or IC device 100. For example, transistors of the functional circuit 103, which have gate electrodes electrically coupled by one or more conductive patterns and/or vias to the pin I, are protectable by the antenna effect protection circuits ANT-I, ANT-E from the antenna effect. In some embodiments, transistors in the antenna effect protection circuits ANT-I, ANT-E have the same size and/or configuration as transistors in the functional circuit 103. In at least one embodiment, transistors in the antenna effect protection circuits ANT-I, ANT-E are identical to transistors in the functional circuit 103. The transistors in the antenna effect protection circuits ANT-I, ANT-E are smaller than and/or have a different configuration from the transistors in the ESD protection circuit.

In at least one embodiment, a layout diagram of the I/O circuit 104, including the antenna effect protection circuit ANT-I, is stored as a cell or module in a standard cell library (also referred to as "cell library"). At a design stage, an APR tool places the antenna effect protection circuit ANT-I, as part of the I/O circuit 104, into a layout diagram of the first die 101. The APR tool performs no or little further routing for the antenna effect protection circuit ANT-I. On the other hand, the antenna effect protection circuit ANT-E comprises one or more antenna cells stored in and/or retrievable from a cell library. An APR tool places the one or more antenna cells into a layout diagram of the first die 101 to form the antenna effect protection circuit ANT-E. The APR tool then performs routing individually for the placed one or more antenna cells. In some embodiments, the antenna effect protection circuit ANT-I includes one or more antenna cells individually placed and/or routed by an APR tool. In some embodiments, one of the antenna effect protection circuits ANT-I, ANT-E is omitted. In some embodiments, one or more antenna cells, or antenna effect protection circuits, are included in the functional circuit 103 to provide antenna effect protection for transistors which are too far from and/or not electrically coupled to the pin I.

The first die 101 is electrically coupled to the second die 102 at one or more die-to-die interconnects. In FIG. 1, a representative die-to-die interconnect 105 is illustrated, and is electrically coupled to the pin I of the first die 101 and to a corresponding pin I of the second die 102. As a result, the pin I of the first die 101 is electrically coupled to the corresponding pin I of the second die 102 through the die-to-die interconnect 105. In some embodiments, the die-to-die interconnect 105 is a TSV in one or more dies of the IC device 100. An example configuration of a TSV in a 3D IC is described with respect to FIGS. 4A-4B.

Figure 2:
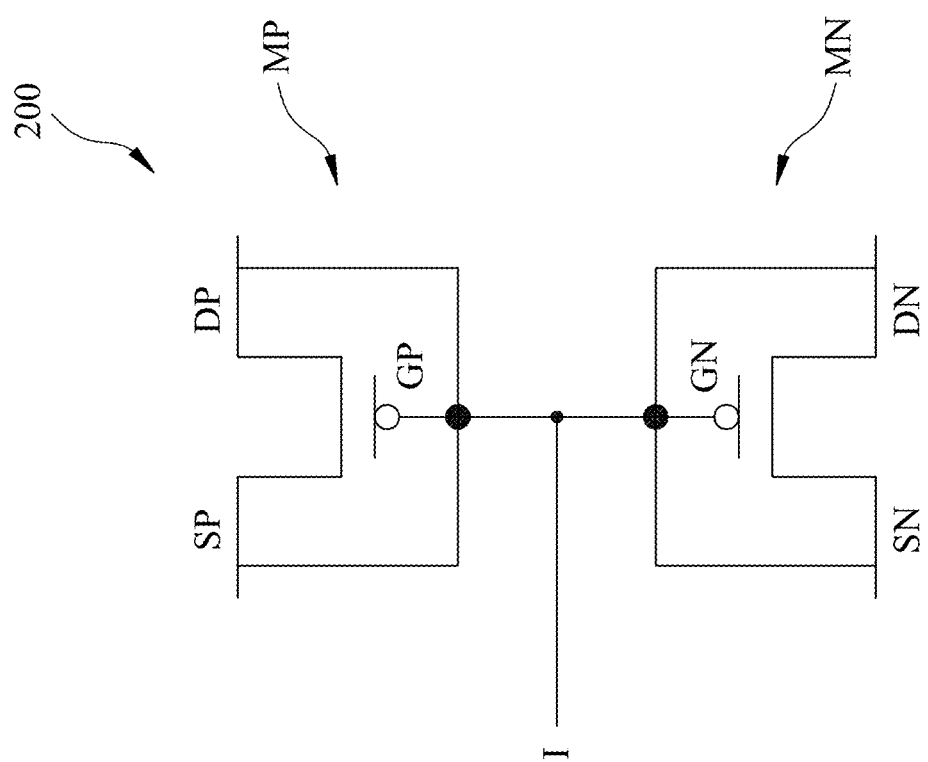
FIG. 2 is a schematic circuit diagram of an antenna effect protection circuit in an IC device, in accordance with some embodiments.

FIG. 2 is a schematic circuit diagram of an antenna effect protection circuit 200 in an IC device, in accordance with some embodiments. In some embodiments, the antenna effect protection circuit 200 corresponds to at least one of the antenna effect protection circuit ANT-I, the antenna effect protection circuit ANT-E, or any antenna effect protection circuit inside the functional circuit 103.

The antenna effect protection circuit 200 comprises a P-type transistor MP, and an N-type transistor MN. The transistor MP comprises a gate terminal GP, a first terminal SP and a second terminal DP which are all electrically coupled together, and to a pin I. In an example, the first terminal SP is a source of the transistor MP, and the second terminal DP is a drain of the transistor MP. The transistor MN comprises a gate terminal GN, a first terminal SN and a second terminal DN which are all electrically coupled together, and to the pin I. In an example, the first terminal SN is a source of the transistor MN, and the second terminal DN is a drain of the transistor MN. In at least one embodiment, the pin I of the antenna effect protection circuit 200 in FIG. 2 corresponds to the pin I of the first die 101 or second die 102 in FIG. 1. In some embodiments, the transistor MP includes a combination of a plurality of P-type transistors which all have corresponding gates, sources and drains electrically coupled together, and to the pin I. In some embodiments, the transistor MN includes a combination of a plurality of N-type transistors which all have corresponding gates, sources and drains electrically coupled together, and to the pin I. Examples of P-type transistors include, but are not limited to, PMOS transistors or the like. Examples of N-type transistors include, but are not limited to, NMOS transistors or the like. In at least one embodiment, the transistor MP is an example of at least one transistor of a first type or a second type, and the transistor MN is an example of at least one transistor of the second type or the first type.

Because the gate, source and drain of each of the transistor MP and transistor MN are electrically coupled together, the transistor MP and transistor MN are electrically coupled as dummy transistors and do not affect operation or functionality of one or more functional circuits electrically coupled to the pin I. The transistor MP and transistor MN form, together with a substrate of an IC device including the antenna effect protection circuit 200, corresponding diode structures that protect transistors of the functional circuits from being damaged due to the antenna effect during the manufacturing process of the IC device.

Figure 3A:
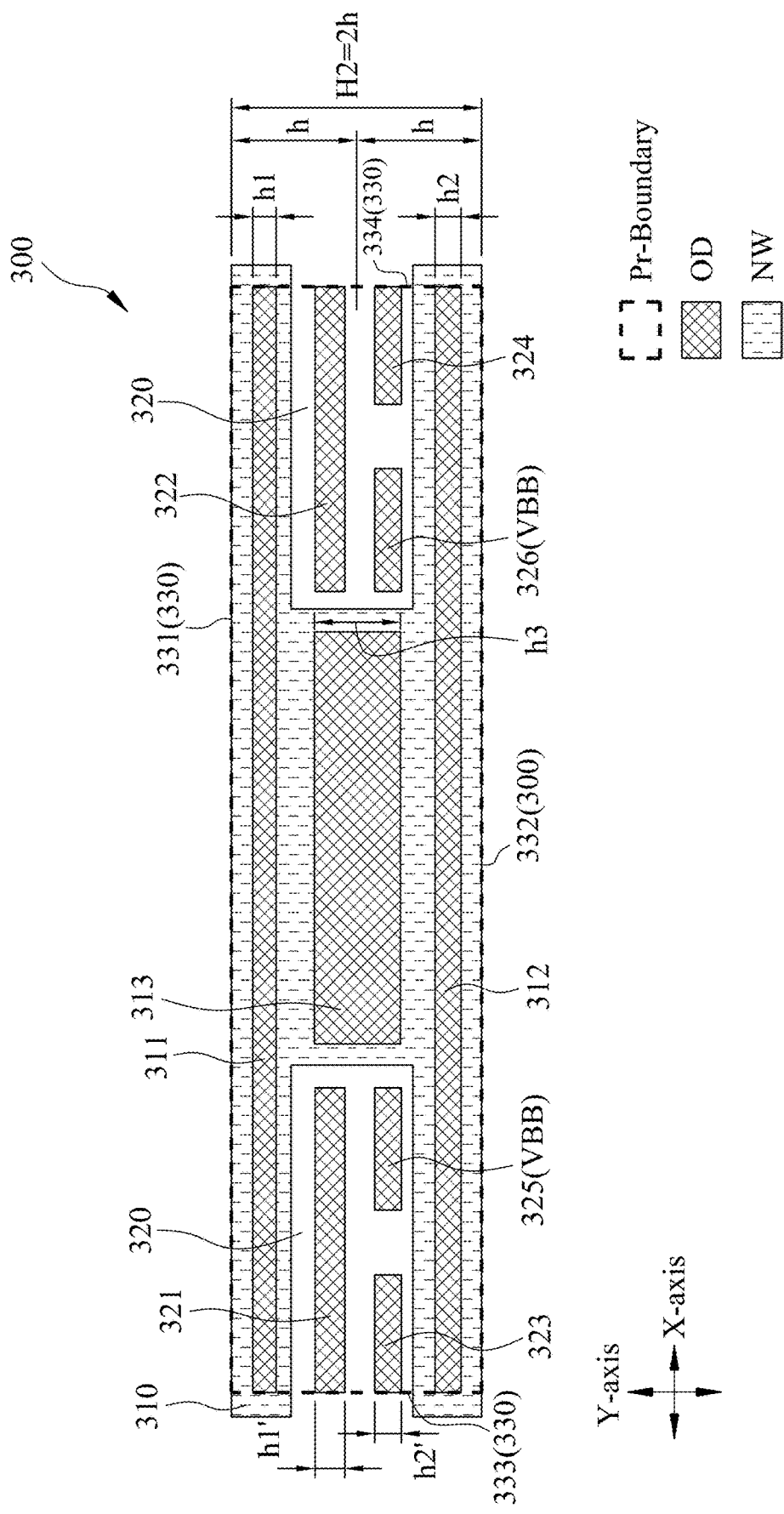
FIGS. 3A-3B are schematic views of various layers in a layout diagram of an antenna cell, in accordance with some embodiments.
Figure 3B:
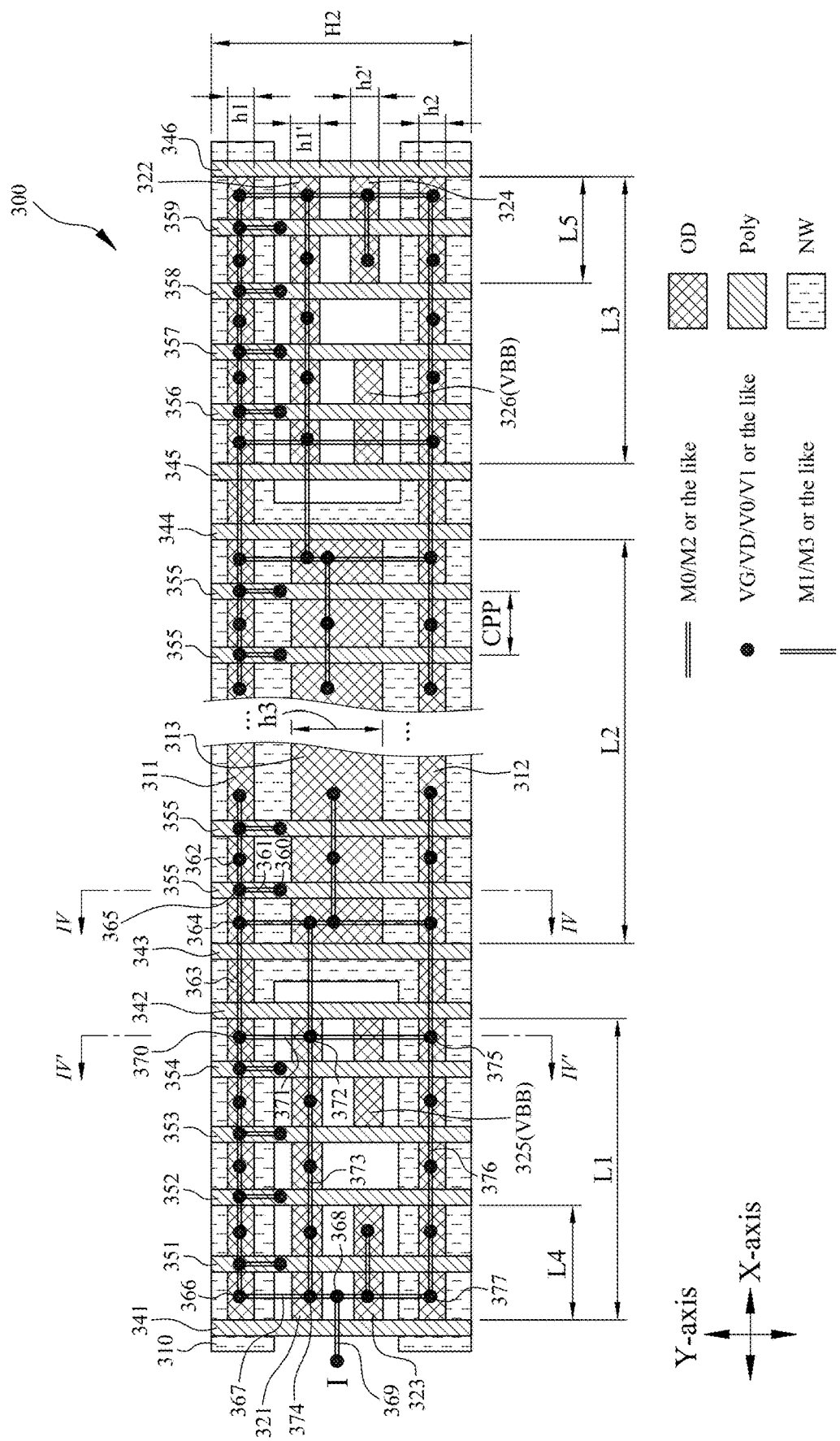

FIGS. 3A-3B are schematic views of various layers in a layout diagram of an antenna cell 300, in accordance with some embodiments. In some embodiments, the antenna cell 300 corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 300 are included in functional circuits to provide antenna effect protection inside the functional circuits, as described herein. In at least one embodiment, the layout diagram of the antenna cell 300 is stored as a standard cell in a standard cell library on a non-transitory computer-readable medium.

As illustrated in FIG. 3A, the antenna cell 300 comprises a plurality of active regions 311-313, 321-326. Active regions are sometimes referred to as oxide-definition (OD) regions or source/drain regions, and are schematically illustrated in the drawings with the label "OD." In at least one embodiment, the active regions 311-313, 321-326 are over a front side of a substrate as described herein. The active regions 311-313, 321-326 are elongated along a first axis, e.g., the X-axis. The active regions 311-313, 321-326 include P-type dopants and/or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. An active region configured to form one or more PMOS devices or transistors is sometimes referred to as "PMOS active region," and an active region configured to form one or more NMOS devices or transistors is sometimes referred to as "NMOS active region." In the example configuration described with respect to FIG. 3A, the active regions 311-313 comprise PMOS active regions, and the active regions 321-326 comprise NMOS active regions. Other configurations are within the scopes of various embodiments. In some embodiments, a PMOS active region is referred to as an active region of a first or second semiconductor type, and an NMOS active region is referred to as an active region of the second or first semiconductor type.

In the example configuration in FIG. 3A, the substrate over which the active regions 311-313, 321-326 are arranged is a P-type substrate, and the PMOS active regions 311-313 are arranged in an N well 310 over the substrate. The N well 310 is schematically illustrated in the drawings with the label "NW." The NMOS active regions 321-326 are arranged over one or more sections 320 of the substrate outside the N well 310. The N well 310 has an H-shape when seen along the first axis or X-axis, or has an I-shape when seen along a second axis or Y-axis transverse to the X-axis. Other configurations are within the scopes of various embodiments. For example, when the substrate is an N-type substrate, the NMOS active regions 321-326 are arranged in a P well over the N-type substrate and the PMOS active regions 311-313 are arranged over one or more sections of the substrate outside the P well.

The antenna cell 300 further comprises a boundary (or cell boundary) 330 which comprises edges 331, 332, 333, 334. The edges 331, 332 are elongated along the X-axis, and the edges 333, 334 are elongated along the Y-axis. The edges 331, 332, 333, 334 are connected together to form the closed boundary 330. In a place-and-route operation (also referred to as "automated placement and routing (APR)") described herein, cells are placed in an IC layout diagram in abutment with each other at their respective boundaries. The boundary 330 is sometimes referred to as "place-and-route boundary" and is schematically illustrated in the drawings with the label "prBoundary." The rectangular shape of the boundary 330 is an example. Other boundary shapes for various cells are within the scope of various embodiments. In the example configuration in FIG. 3A, the edges 331, 332 coincide correspondingly with uppermost and lowermost edges of the N well 310, and the edges 333, 334 coincide correspondingly with leftmost and rightmost edges of the N well 310. In some embodiments, the edges 333, 334 coincide correspondingly with centerlines of dummy or non-functional gate regions 351, 356 as described with respect to FIG. 3B. Other configurations are within the scopes of various embodiments.

In the example configuration in FIG. 3A, each of the PMOS active regions 311, 312 extends continuously along the X-axis, and overlaps the PMOS active region 313 and the NMOS active regions 321-326 along the Y-axis. The PMOS active region 313 and the NMOS active regions 321-326 are arranged between the PMOS active regions 311, 312 along the Y-axis. Along the Y-axis, the PMOS active regions 311-313 correspondingly have widths h1-h3. In at least one embodiment, the width h1 of the PMOS active region 313 is the same as the width h2 of the PMOS active region 312. The width h3 of the PMOS active region 313 is greater than the width h1 and the width h2.

The NMOS active regions 321, 322 are arranged in a same row along the X-axis. In at least one embodiment, a centerline of the NMOS active region 321 along the X-axis coincides with a corresponding centerline of the NMOS active region 322 along the X-axis, and the NMOS active regions 321, 322 have a same width h1' along the Y-axis. In at least one embodiment, the width h1' of the NMOS active regions 321, 322 is the same as the width h1 of the PMOS active region 311. The NMOS active regions 323-326 are arranged in a same row along the X-axis. In at least one embodiment, the NMOS active regions 323-326 share a same centerline along the X-axis, and have a same width h2' along the Y-axis. In at least one embodiment, the width h2' of the NMOS active regions 323-326 is the same as the width h2 of the PMOS active region 312.

Along the X-axis, the PMOS active region 313 is arranged between the NMOS active regions 321, 323, 325 on one side, and NMOS active regions 322, 324, 326 on an opposite side. The NMOS active regions 321-326 overlap the PMOS active region 313 along the X-axis. Along the Y-axis, the NMOS active region 321 is spaced from the NMOS active regions 323, 325, and the NMOS active region 322 is spaced from the NMOS active regions 324, 326. The NMOS active regions 323, 325 are discrete portions spaced from each other along the X-axis, and the NMOS active regions 324, 326 are discrete portions spaced from each other along the X-axis. The width h1' of the NMOS active regions 321, 322 and the width h2' of the NMOS active regions 323-326 are smaller than the width h3 of the PMOS active region 313.

As described herein, the PMOS active regions 311-313 and the NMOS active regions 321-324 are configured to form corresponding PMOS and NMOS transistors which have gates, sources and drains electrically coupled together to form an antenna effect protection circuit. In other words, the PMOS active regions 311-313 and the NMOS active regions 321-324 are configured for antenna usage. The NMOS active regions 325, 326, on the other hand, are not configured for antenna usage. Each of the NMOS active regions 325, 326 is configured to receive a reference voltage VBB. In some embodiments, the reference voltage VBB is a bias voltage applied to the NMOS active regions 325, 326 to avoid substrate latch-up issues in a manner consistent with a standard cell structure when a substrate is interrupted by an N well. In one or more embodiments, the reference voltage VBB is a power supply voltage. In at least one embodiment, the reference voltage VBB is a ground voltage VSS. In some embodiments, one or more of the NMOS active regions 325, 326 are also configured for antenna usage.

In some embodiments, the widths h1, h2, h1', h2' of the PMOS active regions 311, 312 and NMOS active regions 321-324 are the same as corresponding widths of PMOS active regions and NMOS active regions of transistors or cells in one or more functional circuits to be protected from the antenna effect. In at least one embodiment, this configuration facilitates placement and/or abutment of the antenna cell 300 with one or more cells of the one or more functional circuits to be protected. In contrast, the PMOS active region 313 is not to be placed in direct abutment with other cells, and, as a result, it is possible to configure the width h3 of the PMOS active region 313 to provide an intended area of active regions configured for antenna usage, as described herein. In a non-limiting example configuration where the active regions in the antenna cell 300 are configured to form FinFETs, each of the widths h1, h2, h1', h2' corresponds to 2 fins, and the width h3 corresponds to 8 fins. Other configurations are within the scopes of various embodiments.

Between the edges 331, 332 of the boundary 330 and along the Y-axis, the antenna cell 300 contains two sets each having one row of PMOS active regions and one row of NMOS active regions. For example, a first set includes a row containing the PMOS active region 311 and another row containing the NMOS active regions 321, 322, whereas a second set includes a row containing the PMOS active region 312 and another row containing the NMOS active region 323-326. Each set of one row of PMOS active regions and one row of NMOS active regions occupies a height h along the Y-axis. As a result, the antenna cell 300 has a double height H2 equal to 2h. Other configurations are within the scopes of various embodiments. For example, antenna cells having a triple height (3h) are described with respect to FIGS. 5A-5C, 8A-8B, and antenna cells having a quadruple height (4h) are described with respect to FIGS. 6A-6B, 9A-9B. Antenna cells having multiple heights greater than 4h are also within the scopes of various embodiments.

The schematic view in FIG. 3B shows further layers in the layout diagram of the antenna cell 300. For simplicity, the boundary 330 is omitted in FIG. 3B As illustrated in FIG. 3B, the antenna cell 300 further comprises a plurality of gate regions 341-346, 351-359 over the active regions 311-313, 321-326. For simplicity, all gate regions over the PMOS active region 313 are indicated in FIG. 3B by a common reference numeral 355. The gate regions 341-346, 351-359 are elongated along the Y-axis which is transverse to the X-axis. The gate regions 341-346, 351-359 are arranged along the X-axis at a regular pitch designated at CPP (contacted poly pitch) in FIG. 3B. CPP is a center-to-center distance along the X-axis between two directly adjacent gate regions. Two gate regions are considered directly adjacent where there are no other gate regions therebetween. The gate regions 341-346, 351-359 comprise a conductive material, such as, polysilicon, which is sometimes referred to as "poly." The gate regions 341-346, 351-359 are schematically illustrated in the drawings with the label "Poly." Other conductive materials for the gate regions, such as metals, are within the scope of various embodiments. In the example configuration in FIG. 3B, the gate regions 351-359 are functional gate regions which, together with one or more of the active regions 311-313, 321-326, configure a plurality of transistors as described herein. In some embodiments, the gate regions 341-346 are non-functional, or dummy, gate regions. Dummy gate regions are not configured to form transistors together with underlying active regions, and/or one or more transistors formed by dummy gate regions together with the underlying active regions are not electrically coupled to other circuitry in the antenna cell 300 and/or other circuitry in the IC device including the antenna cell 300. In at least one embodiment, non- functional, or dummy, gate regions include dielectric material in a manufactured IC device. In the example configuration in FIG. 3B, the dummy gate regions 341-346 are arranged along and over corresponding edges of one or more of the active regions 311-313, 321-326.

The antenna cell 300 further comprises a plurality of transistors configured by the functional gate regions 351-359 and the active regions 311-313, 321-326. For example, a plurality of PMOS transistors are configured by the functional gate regions 351-359 with each of the PMOS active regions 311, 312, and by the functional gate regions 355 with the PMOS active region 313. As described herein, gates, sources and drains of these PMOS transistors are electrically coupled together. The resulting, electrically coupled PMOS transistors are equivalent to the transistor MP described with respect to FIG. 2. A plurality of NMOS transistors are configured by the functional gate regions 351-354 with the NMOS active region 321, by the functional gate regions 356-359 with the NMOS active region 322, by the functional gate region 351 with the NMOS active region 323, and by the functional gate region 359 with the NMOS active region 324. As described herein, gates, sources and drains of these NMOS transistors are electrically coupled together. The resulting, electrically coupled NMOS transistors are equivalent to the transistor MN described with respect to FIG. 2. Two further NMOS transistors are configured by the functional gate region 354 with the NMOS active region 325, and by the functional gate region 356 with the NMOS active region 326. However, these two further NMOS transistors are not configured for antenna usage; rather, the NMOS active regions 325, 326 of these two further NMOS transistors are configured to receive the reference voltage VBB for substrate bias, as described with respect to FIG. 3A. The number of gate regions over each of the active regions as shown in FIG. 3B is an example. Other configurations are within the scopes of various embodiments.

In the antenna cell 300, the number of PMOS transistors configured for antenna usage is greater than the number of NMOS transistors configured for antenna usage. For this reason, the antenna cell 300 is sometimes referred to as a PMOS dominating antenna cell. Other examples of PMOS dominating antenna cells are described with respect to FIGS. 5A-5C, 6A-6B. In some embodiments, an antenna cell having a greater number of NMOS transistors configured for antenna usage than a number of PMOS transistors configured for antenna usage is sometimes referred to as an NMOS dominating antenna cell. Examples of NMOS dominating antenna cells are described with respect to FIGS. 7A-7B, 8A-8B, 9A-9B.

The antenna cell 300 further comprises contact structures (not shown in FIG. 3B) over and in electrical contact with corresponding source/drains of the PMOS and NMOS transistors in the active regions 311-313, 321-326. Contact structures are sometimes referred to as metal-to-device structures, and are schematically illustrated in the drawings with the label "MD." An MD contact structure includes a conductive material formed over a corresponding source/drain in the corresponding active region to define an electrical connection from one or more devices formed in the active region to other internal circuitry of the IC or to outside circuitry. Examples of MD contact structures are described with respect to FIGS. 4A-4B.

The antenna cell 300 further comprises via structures over and in electrical contact with the corresponding gate regions or contact structures. A via structure over and in electrical contact with a contact structure is sometimes referred to as via-to-device (VD). A via structure over and in electrical contact with a gate region is sometimes referred to as via-to-gate (VG). VD and VG via structures are schematically illustrated in the drawings with the corresponding labels "VD" and "VG." An example material of the VD and VG via structures includes metal. Other configurations are within the scopes of various embodiments. Examples of VD and VG via structures are described herein below.

The antenna cell 300 further comprises a plurality of metal layers and via layers sequentially and alternatingly arranged over the VD, VG via structures. The lowermost metal layer immediately over and in electrical contact with the VD, VG via structures is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Via structures in the V0 layer are referred to as V0 via structures, via structures in the V1 layer are referred to as V1 via structures, or the like. Examples of various metal layers and via layers are described herein below. For simplicity, via structures, such as VG, VD, V0, V1, or the like, are schematically illustrated in the drawings by solid circles, conductive patterns in even metal layers, such as M0, M2, or the like, are schematically illustrated in the drawings by horizontal lines, and conductive patterns in odd metal layers, such as M1, M3, or the like, are schematically illustrated in the drawings by vertical lines. In some embodiments, the antenna cell 300 comprises one or more backside metal layers and/or backside via structures arranged on a back side of the substrate. An example material of various metal layers and via structures includes metal. Other configurations are within the scopes of various embodiments.

The PMOS and NMOS transistors in the antenna cell 300 have gates, sources and drains electrically coupled together by various conductive patterns in one or more metal layers and corresponding via structures. As shown in FIG. 3B, the conductive patterns and via structures together form an interconnect arrangement electrically coupling the gates, sources and drains of the PMOS and NMOS transistors to a pin I. In some embodiments, the pin I in the antenna cell 300 corresponds to the pin I in at least one of FIGS. 1-2.

For example, the functional gate region 355 is electrically coupled by a VG via structure 360 to an M0 conductive pattern (not shown), which is further electrically coupled by a V0 via structure (also designated by the reference numeral 360), to an M1 conductive pattern 361. A source/drain of the PMOS transistor formed by the functional gate region 355 and the PMOS active region 311 is electrically coupled by an MD contact structure (not shown) and a VD via structure 362 to an elongated M0 conductive pattern 363. Another source/drain of the PMOS transistor formed by the functional gate region 355 and the PMOS active region 311 is electrically coupled by an MD contact structure (not shown) and a VD via structure 364 to the M0 conductive pattern 363. In at least one embodiment, the M0 conductive pattern 363 extends along the X-axis to be electrically coupled to all source/drains of all PMOS transistors formed over the PMOS active region 311. The M0 conductive pattern 363 is electrically coupled by a V0 via structure 365 to the M1 conductive pattern 361. The M0 conductive pattern 363 is electrically coupled by a V0 via structure 366 to an M1 conductive pattern 367. The M1 conductive pattern 367 is electrically coupled by a V1 via structure 368 to an M2 conductive pattern 369 which is electrically coupled to the pin I.

For another example, another source/drain over the PMOS active region 311 is electrically coupled by an MD contact structure (not shown) and a VD via structure 370 to the M0 conductive pattern 363. The M0 conductive pattern 363 is electrically coupled by a V0 via structure (also designated by the reference numeral 370) to an M1 conductive pattern 371. A source/drain over the PMOS active region 321 is electrically coupled by an MD contact structure (not shown) and a VD via structure 372 to an M0 conductive pattern 373. The M0 conductive pattern 373 is electrically coupled by a V0 via structure 374 to the M1 conductive pattern 367, which is electrically coupled to the pin I, as described herein. A source/drain over the PMOS active region 312 is electrically coupled by an MD contact structure (not shown) and a VD via structure 375 to an elongated M0 conductive pattern 376. In at least one embodiment, the M0 conductive pattern 376 extends along the X-axis to be electrically coupled to all source/drains of all PMOS transistors formed over the PMOS active region 312. The M0 conductive pattern 376 is electrically coupled by a V0 via structure 377 to the M1 conductive pattern 367, which is electrically coupled to the pin I, as described herein.

In at least one embodiment, the pin I is electrically coupled to an end of a TSV (not shown in FIG. 3B), as described with respect to FIG. 1. An example TSV is described with respect to FIGS. 4A-4B. TSVs often have high aspect ratios, and may accumulate a large amount of charges during manufacturer, especially during TSV processes for manufacturing the TSVs. When a TSV is electrically coupled to an I/O pin, the charges accumulated on the TSV may cause antenna effect related damages to gate dielectric materials under the gate electrodes or gate regions that are electrically coupled to the I/O pin. In some situations, antenna effect related issues caused by TSV processes are worse than antenna effect related issues caused by metal layer deposition and/or patterning. To ensure that antenna effect related issues caused by TSV processes are fixed or prevented, one or more antenna effect protection circuits or antenna cells electrically coupled to a TSV and a corresponding I/O pin are configured to satisfy antenna design rules. Example antenna design rules are as follows:

$$\frac{\text{Area}_{(Tsv)}}{\text{Area}_{(Gate)}} \leq \text{Area}_{(OD)} \times 40 + 1.7 \quad (1)$$

-continued $$\text{Density}_{(OD+Gate)} = \frac{\text{Area}_{(OD+Gate)}}{\text{Area}_{(prBoundary)}} \quad (2)$$

where $\text{Area}_{(TSV)}$ is the area of the TSV to be protected from, $\text{Area}_{(Gate)}$ is the total area of gate regions configured for antenna usage in an antenna cell electrically coupled to the TSV, $\text{Area}_{(OD)}$ is the total area of active regions configured for antenna usage in the antenna cell, $\text{Area}_{(OD+Gate)}$ is the sum of $\text{Area}_{(Gate)}$ and $\text{Area}_{(OD)}$, $\text{Area}_{(prBoundary)}$ is the area inside the boundary of the antenna cell, and $\text{Density}_{(OD+Gate)}$ corresponds to the chip area efficiency of the antenna cell. Other antenna design rules are within the scopes of various embodiments.

Based on relationship (1), at a given $\text{Area}_{(TSV)}$, the antenna design rule is satisfied and/or antenna effect protection capability of an antenna cell is improved by increasing at least one of $\text{Area}_{(Gate)}$ or $\text{Area}_{(OD)}$. Based on relationship (2), the increase of at least one of $\text{Area}_{(Gate)}$ or $\text{Area}_{(OD)}$ results in a greater $\text{Area}_{(OD+Gate)}$ and an improved chip area efficiency of the antenna cell.

For the antenna cell 300, $\text{Area}_{(OD)}$ is determined as follows:

$$\text{Area}_{(OD)} = h1 \times (L1+L2+L3) + h3 \times L2 + h2 \times (L1+L2+L3) + h1' \times (L1+L3) + h2' \times (L4+L5)$$

where a length L1 is a distance between facing edges of gate regions 341 and 342, a length L2 is a distance between facing edges of gate regions 343 and 344, a length L3 is a distance between facing edges of gate regions 345 and 346, a length L4 is a distance between facing edges of gate regions 341 and 352, and a length L5 is a distance between facing edges of gate regions 346 and 358. $\text{Area}_{(Gate)}$ is the sum of areas of functional gate regions 351-359 configured for antenna usage. In at least one embodiment, dummy gate regions 341-346 are not considered in determining $\text{Area}_{(Gate)}$. In at least one embodiment, it is possible to adjust $\text{Area}_{(OD)}$, by adjusting at least one of width h3 or length L2 of the PMOS active region 313. As a result, in one or more embodiments, it is possible to satisfy or even exceed the antenna design rules per relationship (1), while achieving an increased chip area efficiency per relationship (2).

As described with respect to FIGS. 3A-3B, a substantial portion of the area of all active regions, including PMOS and NMOS active regions, in the antenna cell 300 is configured for antenna usage. This is a difference from other approaches in which active regions of only one semiconductor type, e.g., NMOS active regions, are configured for antenna usage, whereas active regions of the other semiconductor type, e.g., PMOS active regions, are not configured for antenna usage. As a result, in at least one embodiment, the antenna cell 300 achieves a better chip area efficiency for antenna usage than the other approaches.

Some other approaches utilize antenna cells of a single height. In contrast, antenna cells in one or more embodiments have multiple heights, e.g., the antenna cell 300 has the double height. The multiple height of an antenna cell in accordance with some embodiments permits at least one active region of an increased width to be included in the antenna cell. For example, the antenna cell 300 with the double height has the PMOS active region 313 with the increased width h3. The PMOS active region 313 with the increased width h3 increases the chip area efficiency for antenna usage in at least one embodiment.

In some embodiments, at least one of the length L2 or the increased width h3 of the PMOS active region 313 is configurable or adjustable to obtain the intended area of active regions configured for antenna usage, i.e., to obtain an intended value of Area$_{(OD)}$. This customizable configuration provides design flexibility which is advantageous in one or more embodiments.

Despite the presence of at least one active region with an increased width, e.g., the PMOS active region 313 in the antenna cell 300, it is still possible to place and/or abut the antenna cell 300 with other cells having smaller active region widths, such as cells of one or more functional circuits to be protected. This advantage is achievable, as described herein, by arranging along the edges of the antenna cell 300 further active regions 311-312, 321-324 having the same width(s) as active regions in the other cells of the functional circuits.

Antenna cells having multiple heights in accordance with some embodiments are larger than antenna cells of a single height of the other approaches. As a result, to provide the same or equivalent antenna effect protection, the other approaches need a larger number of smaller and less efficient antenna cells, whereas it is sufficient in some embodiments to use a fewer number of antenna cells with larger areas and a better chip area efficiency for antenna usage. The fewer number of antenna cells in some embodiments reduces routing efforts by an APR tool to route conductive patterns and/or vias to the fewer antenna cells, which simplifies and/or speeds up the IC design and/or manufacturing processes.

In a specific non-limiting example, the other approaches require about 72 smaller, single height antenna cells, whereas one double height antenna cell in accordance with one or more embodiments is sufficient to provide the same or equivalent antenna effect protection. Further, the double height antenna cell in accordance with one or more embodiments occupies only about 29% of the chip area occupied by the 72 smaller, single height antenna cells of the other approaches. The amount of routing efforts for routing one antenna cell in accordance with some embodiments is significantly reduced compared to routing efforts for routing about 72 antenna cells of the other approaches.

Figure 4A:
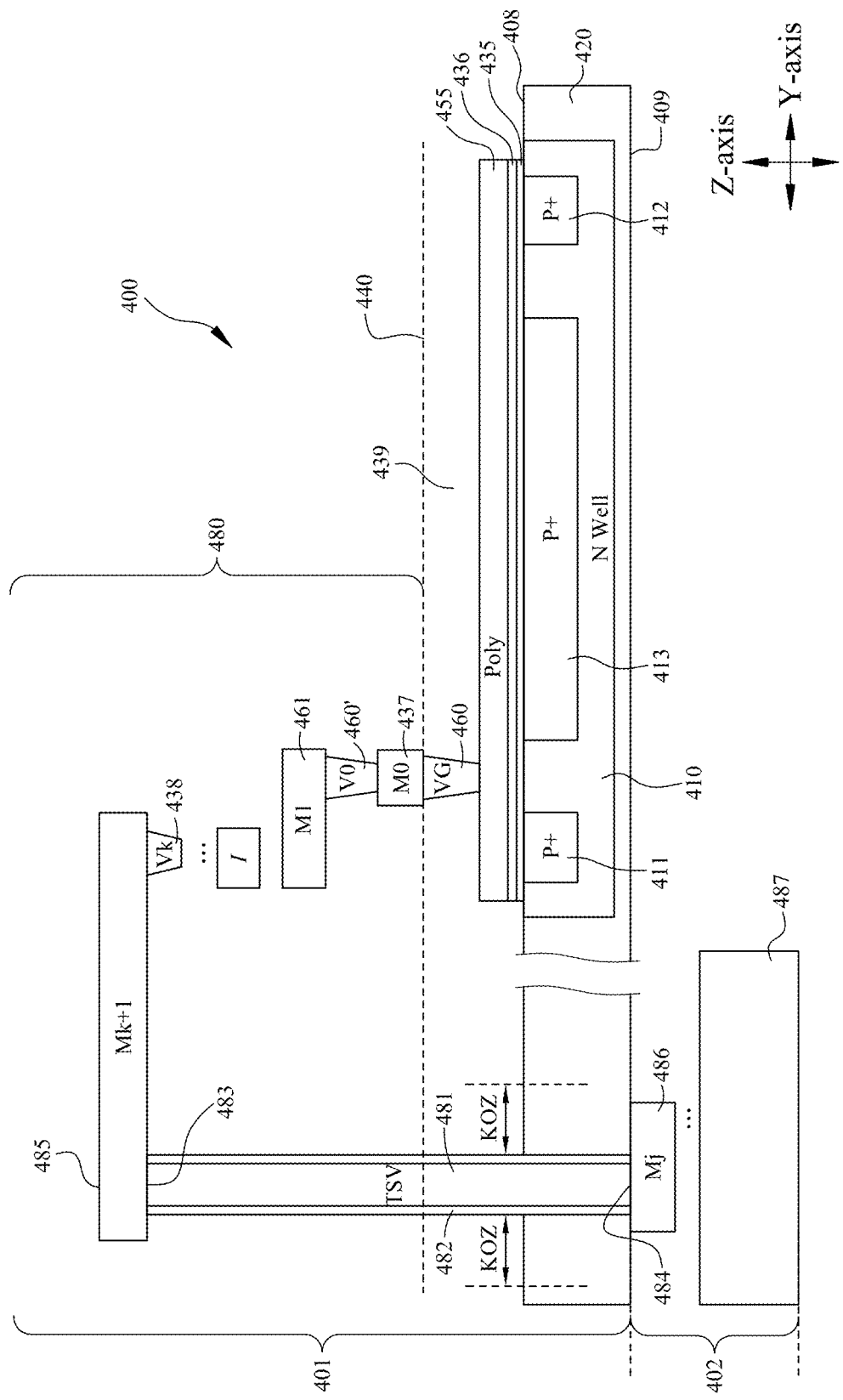
FIG. 4A is a schematic cross-sectional view, taken along line IV-IV in FIG. 3B, of an IC device, in accordance with some embodiments.
Figure 4B:
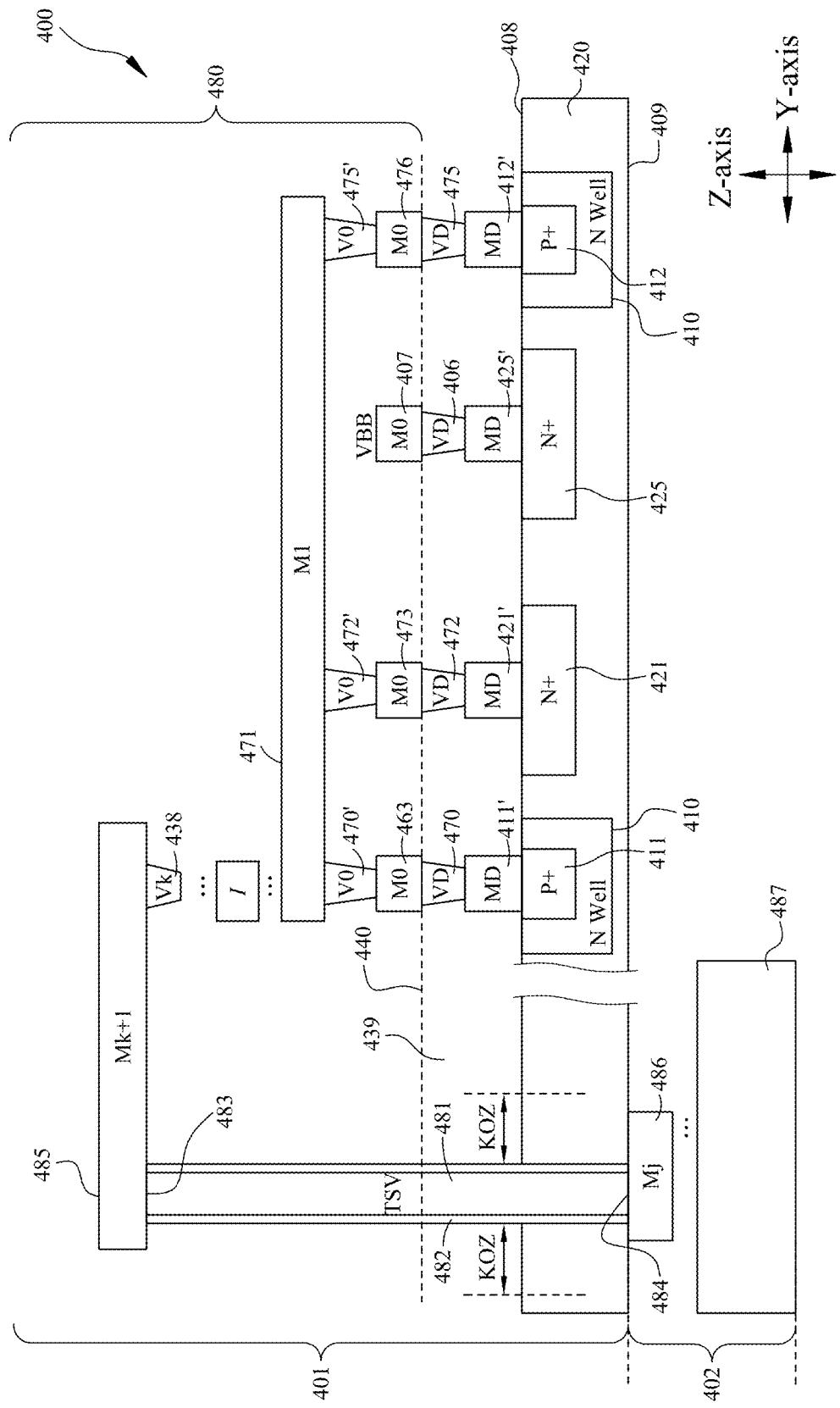
FIG. 4B is a schematic cross-sectional view, taken along line IV'-IV' in FIG. 3B, of an IC device, in accordance with some embodiments.

FIGS. 4A and 4B are schematic cross-sectional views, correspondingly taken along lines IV-IV and IV'-IV' in FIG. 3B, of an IC device 400, in accordance with some embodiments. The IC device 400 comprises an antenna effect protection circuit corresponding to the antenna cell 300 described with respect to FIGS. 3A-3B. Components in FIGS. 4A-4B having corresponding components in FIGS. 3A-3B are designated by the reference numerals of FIGS. 3A-3B increased by 100.

As illustrated in FIG. 4A, the IC device 400 comprises a substrate 420 over which the antenna effect protection circuit corresponding to the antenna cell 300 is formed. The substrate 420 has a thickness direction along a Z-axis. P-type and N-type dopants are added to the substrate 420 to correspondingly form P-doped regions 411, 412, 413 corresponding to PMOS active regions 311, 312, 313, N-doped regions 421, 425 (shown in FIG. 4B) corresponding to NMOS active regions 321, 325, and an N well 410 which corresponds to the N well 310 and in which the P-doped regions 411, 412, 413 are formed. In some embodiments, isolation structures are formed between adjacent P well/P-doped regions and N well/N-doped regions. For simplicity, isolation structures are omitted from FIGS. 4A-4B.

The IC device 400 further comprises a gate stack including gate dielectric layers 435, 436, and the gate electrode 455 corresponds to a functional gate region 355 in FIG. 3B. In at least one embodiment, a gate dielectric layer replaces multiple gate dielectric layers 435, 436. Example materials of the gate dielectric layer or layers include $HfO_2$, $ZrO_2$, or the like. Example materials of the gate electrode 455 include polysilicon, metal, or the like. A plurality of transistors is formed in the antenna effect protection circuit by the functional gate regions and the underlying active regions, as described herein.

In some embodiments, transistors of functional circuits to be protected by the antenna effect protection circuit are formed by the same processes to include the same configuration as the transistors of the antenna effect protection circuit.

The IC device 400 further comprises MD contact structures as described herein. For example, as illustrated in FIG. 4B, MD contact structures 411', 412', and 421', 425' are correspondingly over and in electrical contact with P-doped regions 411, 412, and N-doped regions 421, 425.

The IC device 400 further comprises VD, VG via structures over and in electrical contact with corresponding MD contact structures and gate regions. For example, as illustrated in FIG. 4A, a VG via structure 460 corresponding to the VG via structure 360 is over and in electrical contact with the gate electrode 455. For another example, as illustrated in FIG. 4B, VD via structures 470, 475, 472, 406 are correspondingly over and in electrical contact with the MD contact structures 411', 412', and 421', 425'.

The IC device 400 further comprises an interconnect structure 480 which is over the VD, VG via structures. The interconnect structure 480 comprises a plurality of metal layers M0, M1, . . . and a plurality of via layers V0, V1, . . . arranged alternatingly in the thickness direction of the substrate 420, i.e., along the Z axis. The interconnect structure 480 further comprises various interlayer dielectric (ILD) layers (not shown) in which the metal layers and via layers are embedded. The metal layers and via layers of the interconnect structure 480 are configured to electrically couple various elements or circuits of the IC device 400 with each other, and with external circuitry. For simplicity, some metal layers and via layers are omitted in FIGS. 4A-4B. Several examples of conductive patterns and via structures in the interconnect structure 480 are described herein.

In FIG. 4A, the gate electrode 455 is electrically coupled by the VG via structure 460 to an M0 conductive pattern 437, which is further electrically coupled by a V0 via structure 460' to an M1 conductive pattern 461. The M1 conductive pattern 461 is electrically coupled, by one or more metal layers and/or one or more via layers, to a pin I which corresponds to the pin I of the antenna cell 300 in one or more embodiments.

In FIG. 4B, the P-doped region 411 is electrically coupled by the MD contact structure 411' and a VD via structure 470 to an M0 conductive pattern 463, which is electrically coupled by a V0 via structure 470' to an M1 conductive pattern 471. The N-doped region 421 is electrically coupled by the MD contact structure 421' and a VD via structure 472 to an M0 conductive pattern 473, which is electrically coupled by a V0 via structure 472' to the M1 conductive pattern 471. The P-doped region 412 is electrically coupled by the MD contact structure 412' and a VD via structure 475 to an M0 conductive pattern 476, which is electrically coupled by a V0 via structure 475' to the M1 conductive pattern 471, which is electrically coupled, by one or more metal layers and/or one or more via layers, to the pin I. The N-doped region 425 is electrically coupled by the MD contact structure 425' and a VD via structure 406 to an M0 conductive pattern 407. The M0 conductive pattern 407 is not electrically coupled to the M1 conductive pattern 471 or the pin I; instead, the M0 conductive pattern 407 is configured to receive the reference voltage VBB.

As illustrated in FIGS. 4A-4B, the IC device 400 further comprises a TSV 481 in the substrate 420. A liner layer 482 is between the conductive material of the TSV 481 and the substrate 420, to prevent short circuit between the TSV 481 and the substrate 420. A keep-out zone (KOZ) is configured around the TSV 481 to define a region where no devices or transistors are to be placed or formed. The TSV 481 has a first end or upper end 483, and a second end or lower end 484. The first end 483 of the TSV 481 is electrically coupled to a conductive pattern 485 in the Mk+1 layer. The conductive pattern 485 is electrically coupled to the pin I by one or more metal layers and/or one or more via layers, as schematically illustrated in FIGS. 4A-4B at a via structure 438 in the Vk layer. The second end 484 of the TSV 481 is exposed on a backside 409 of the substrate 420, and is configured to be electrically coupled to another die in a 3D IC configuration, or to be electrically coupled to an I/O pad or bump through backside metallization.

In the example configuration in FIGS. 4A-4B, the IC device 400 has a 3D IC configuration and comprises a first die 401 and a second die 402 which are stacked one over another along the Z-axis, are physically bonded together, and are electrically coupled to each other. In at least one embodiment, the first die 401 and second die 402 correspond to the first die 101 and second die 102, and the TSV 481 corresponds to a TSV which forms the die-to-die interconnect 105 between the first die 101 and the second die 102, as described with respect to FIG. 1. The first die 401 comprises the substrate 420, the TSV 481 in the substrate 420, together with the active regions, gate regions, MD contact structures, VG via structures, VD via structures and interconnect structure 480 formed over the substrate 420. The second die 402 comprises a substrate 487 together with various active regions, gate regions, MD contact structures, VG via structures, VD via structures and interconnect structure formed over the substrate 487 in manners similar to the formation of the first die 401. The second die 402 comprises a conductive pattern 486 in the $M_j$ layer of the interconnect structure of the second die 402. The conductive pattern 486 is electrically coupled to the second end 484 of the TSV 481, thereby electrically coupling the first die 401 and the second die 402.

In some embodiments, the second die 402 comprises an antenna effect protection circuit (not shown) as described with respect to the second die 102 in FIG. 1. In at least one embodiment, the antenna effect protection circuit of the second die 402 is electrically coupled to the second end 484 of the TSV 481 via the conductive pattern 486. As a result, both ends 483, 484 of the TSV 481 are electrically coupled to corresponding antenna effect protection circuits.

In a first example manufacturing process, the second die 402 is manufactured to include various active regions, gate regions, MD contact structures, VG via structures, VD via structures and interconnect structure over the substrate 487. The manufactured second die 402 is then bonded to a backside 409 of the substrate 420. Specifically, a top layer of the interconnect structure of the second die 402 is bonded to the backside 409 of the substrate 420, so that the conductive pattern 486 to be electrically coupled to the first die 401 is adjacent the backside 409 of the substrate 420. Further, front-end-of-line (FEOL) manufacturing processes are performed to form various active regions, gate regions, MD contact structures, VG via structures, VD via structures over a front side 408 of the substrate 420 after bonding with the second die 402. Next, back-end-of-line (BEOL) manufacturing processes are performed to form at least a part of the interconnect structure 480 of the first die 401 over a resulting structure obtained at the end of the FEOL manufacturing processes. One or more etching operations are then performed to form a via through various layers of the interconnect structure 480 and the substrate 420 to expose the conductive pattern 486 of the second die 402. A liner material is deposited over an inner wall of the via to form the liner layer 482. A conductive material is filled into the via, over the liner layer 482 to form the TSV 481 which is in physical and electrical contact with the conductive pattern 486 of the second die 402. An Mk+1 metal layer is deposited over the first end 483 of the TSV 481, and the deposited Mk+1 metal layer is patterned to form the conductive pattern 485 which electrically couples the first end 483 of the TSV 481 and the pin I. In some embodiments, one or more further metal layers and/or via layers are deposited and patterned over the Mk+1 metal layer.

In a second example manufacturing process, the TSV 481 is formed at an earlier stage. Specifically, as in the first example manufacturing process, the second die 402 is manufactured then bonded to the backside 409 of the substrate 420, and FEOL manufacturing processes are performed after the bonding to form various active regions, gate regions, MD contact structures, VG via structures, VD via structures over a front side 408 of the substrate 420. A difference in the second example manufacturing process is that the TSV 481 is formed at the end of the FEOL manufacturing processes, before the BEOL manufacturing processes. More particularly, the resulting structure obtained at the end of the FEOL manufacturing processes includes a dielectric layer 439 covering the front side 408 of the substrate 420 and having a top surface 440. The TSV 481 is formed to extend from the top surface 440 through the dielectric layer 439 and through the substrate 420 to the conductive pattern 486 of the second die 402. As a result, the first end 483 of the TSV 481 is now at the top surface 440 of the dielectric layer 439. In subsequent BEOL manufacturing processes, the first end 483 of the TSV 481 is electrically coupled, by one or more metal layers and/or one or more via layers in the interconnect structure 480, to the pin I.

In a third example manufacturing process, the TSV 481 is formed at an even earlier stage. Specifically, as in the first example manufacturing process, the second die 402 is manufactured then bonded to the backside 409 of the substrate 420. A difference in the third example manufacturing process is that the TSV 481 is formed after the bonding, but before performing FEOL manufacturing processes over the substrate 420 to manufacture the first die 401. More particularly, after bonding the substrate 420 to the second die 402, the TSV 481 is formed to extend from the front side 408, through the substrate 420 to the conductive pattern 486 of the second die 402. As a result, the first end 483 of the TSV 481 is now at the front side 408 of the substrate 420. In subsequent FEOL and BEOL manufacturing processes, the first end 483 of the TSV 481 is electrically coupled to the pin I, by one or more FEOL contact structures and by one or more metal layers and/or via layers formed in the interconnect structure 480 by the BEOL manufacturing processes. The described manufacturing processes are examples. Other configurations are within the scopes of various embodiments.

In at least one embodiment, the IC device 400 has a configuration other than a 3D IC configuration. For example, the second die 402 is omitted. In this example configuration, the conductive pattern 486 belongs to a backside metal layer on the backside 409 of the substrate 420, and is electrically coupled, by one or more backside metal layers and/or backside via layers formed in backside BEOL manufacturing processes, to an I/O pad or bump for connection with external circuitry. In at least one embodiment, one or more advantages described herein with respect to FIGS. 1, 2, 3A-3B are achievable in the IC device 400.

Figure 5A:
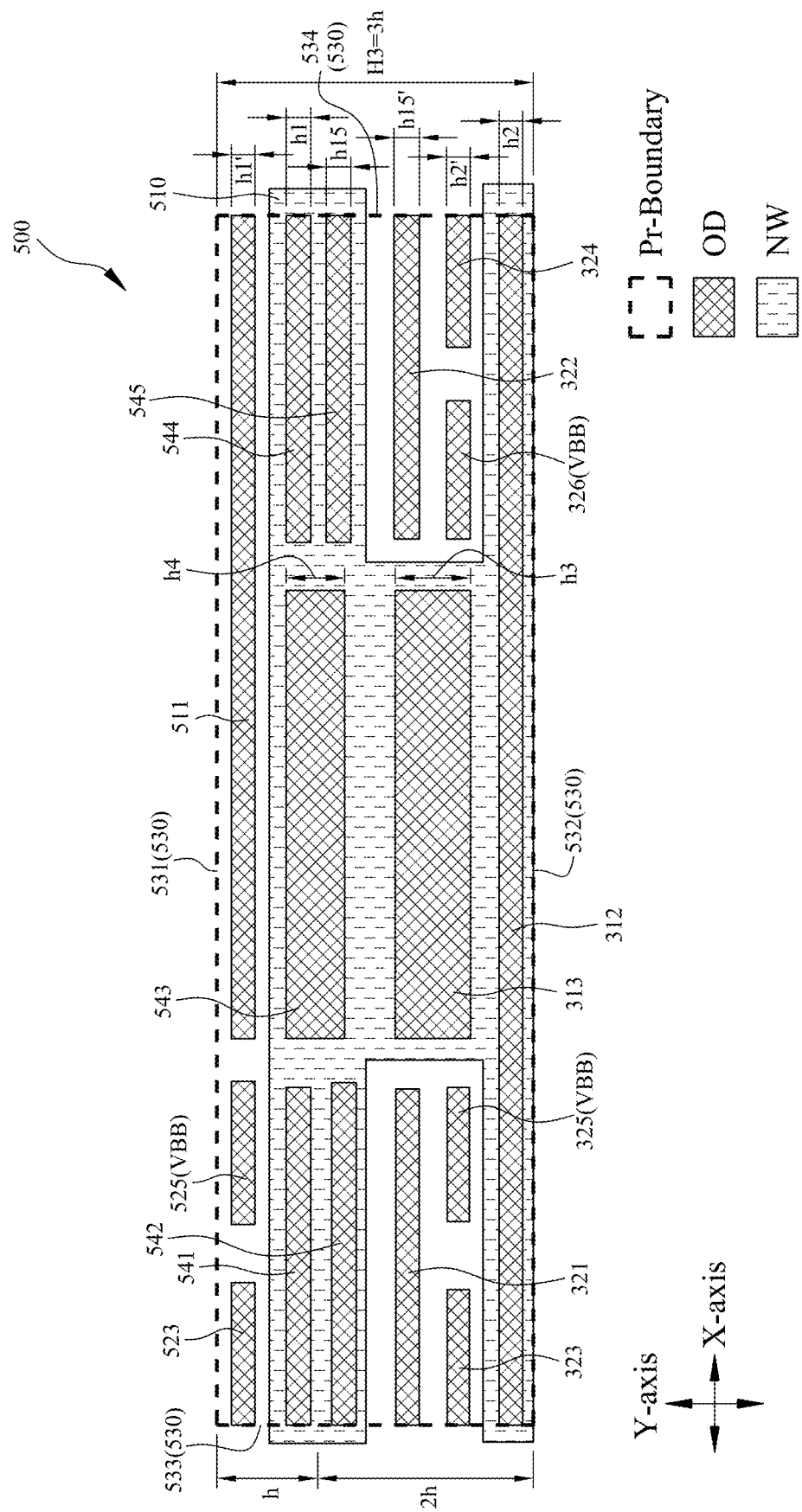
FIGS. 5A-5C, 6A-6B, 7A-7B, 8A-8B, 9A-9B are schematic views of various layers in layout diagrams of antenna cells, in accordance with some embodiments.
Figure 5B:
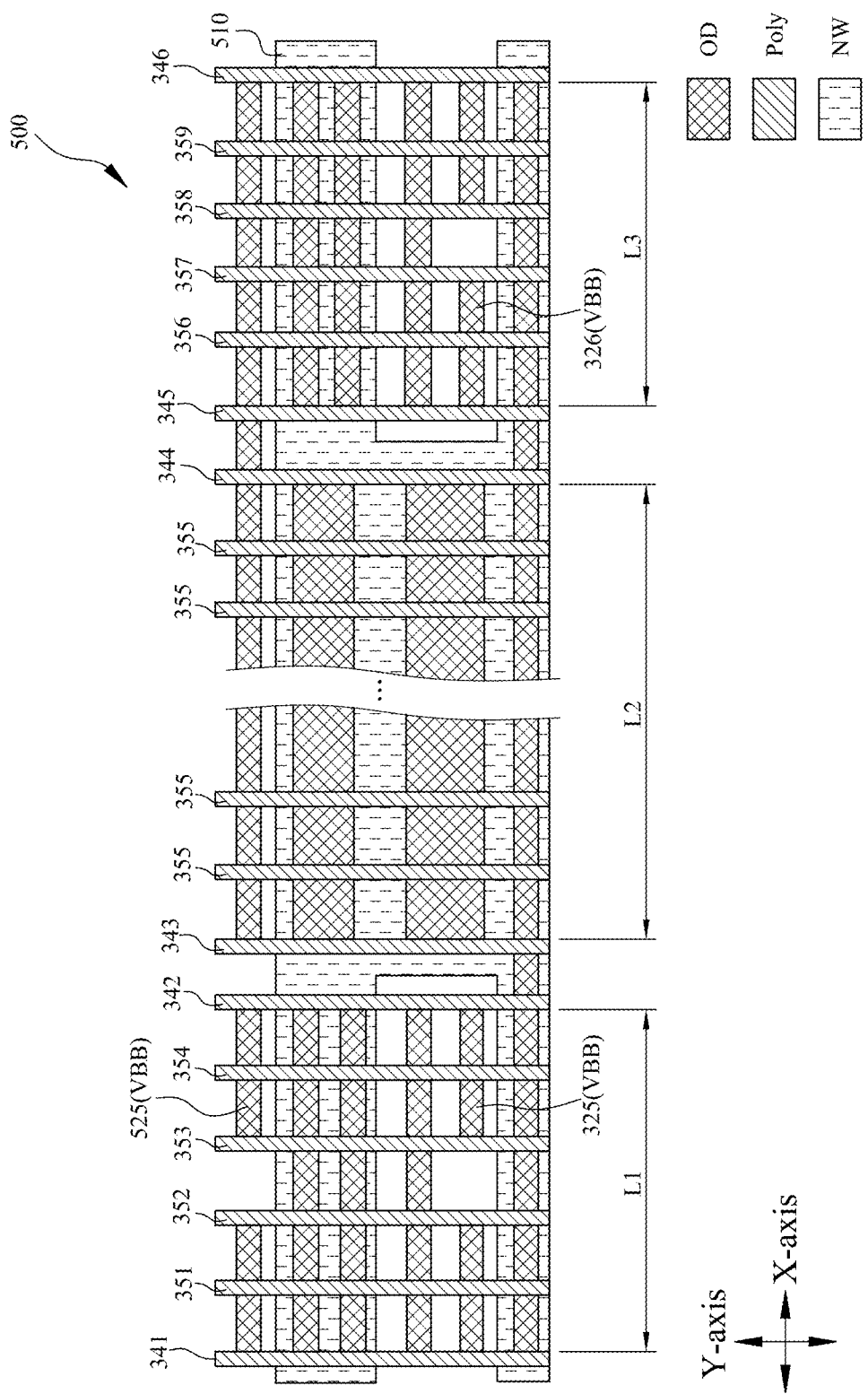

FIGS. 5A-5B are schematic views of various layers in a layout diagram of an antenna cell 500, in accordance with some embodiments. In some embodiments, the antenna cell 500 corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 500 are included in functional circuits to provide antenna effect protection inside the functional circuits, as described herein. In at least one embodiment, the layout diagram of the antenna cell 500 is stored as a standard cell in a standard cell library on a non-transitory computer-readable medium. Components in FIGS. 5A-5B having corresponding components in FIGS. 3A-3B are designated by the same reference numerals of FIGS. 3A-3B.

A difference between the antenna cell 300 and the antenna cell 500 is that the antenna cell 500 has a triple height of H3 or 3h.

In FIG. 5A, the antenna cell 500 comprises a boundary 530 with edges 531-534 corresponding to the boundary 330 and edges 331-334 of the antenna cell 300. The antenna cell 500 further comprises an N well 510 corresponding to the N well 310 of the antenna cell 300. The antenna cell 500 further comprises PMOS active regions 312, 313, 541-545, and NMOS active regions 321-326, 523, 525, 511. The NMOS active regions 325, 326, 525 are configured to receive the reference voltage VBB. In some embodiments, the widths h1, h1', h2, h2', h15, h15' of the active regions along the edges 533, 534 of the boundary 530 are equal to the widths of active regions in cells or functional circuits to be protected, to facilitate cell placement and/or abutment. The PMOS active regions 313, 543 have corresponding increased widths h3, h4 that contribute to an increased chip area efficiency. The PMOS active regions 313, 543 are spaced from each other along the Y-axis. Other configurations are within the scopes of various embodiments. For example, the PMOS active regions 313, 543 are merged into a single PMOS active region, as described with respect to FIG. 5C. In the example configuration in FIG. 5A, each of the widths h1, h1', h2, h2', h15, h15' corresponds to 2 fins, the width h4 corresponds to 5 fins, and the width h3 corresponds to 8 fins. Other configurations are within the scopes of various embodiments.

In FIG. 5B, the antenna cell 500 further comprises dummy gate regions 341-346 and functional gate regions 351-359 over the active regions. The functional gate regions 351-359 and the underlying active regions form a plurality of PMOS transistors and NMOS transistors which have gates, sources and drains electrically coupled together, and to a pin I (not shown) in a manner similar to the antenna cell 300. For simplicity, various interconnect structures, vias, conductive patterns are omitted in FIG. 5B. In at least one embodiment, one or more advantages described herein are achievable by the antenna cell 500, and/or by an IC device including the antenna cell 500.

Figure 5C:
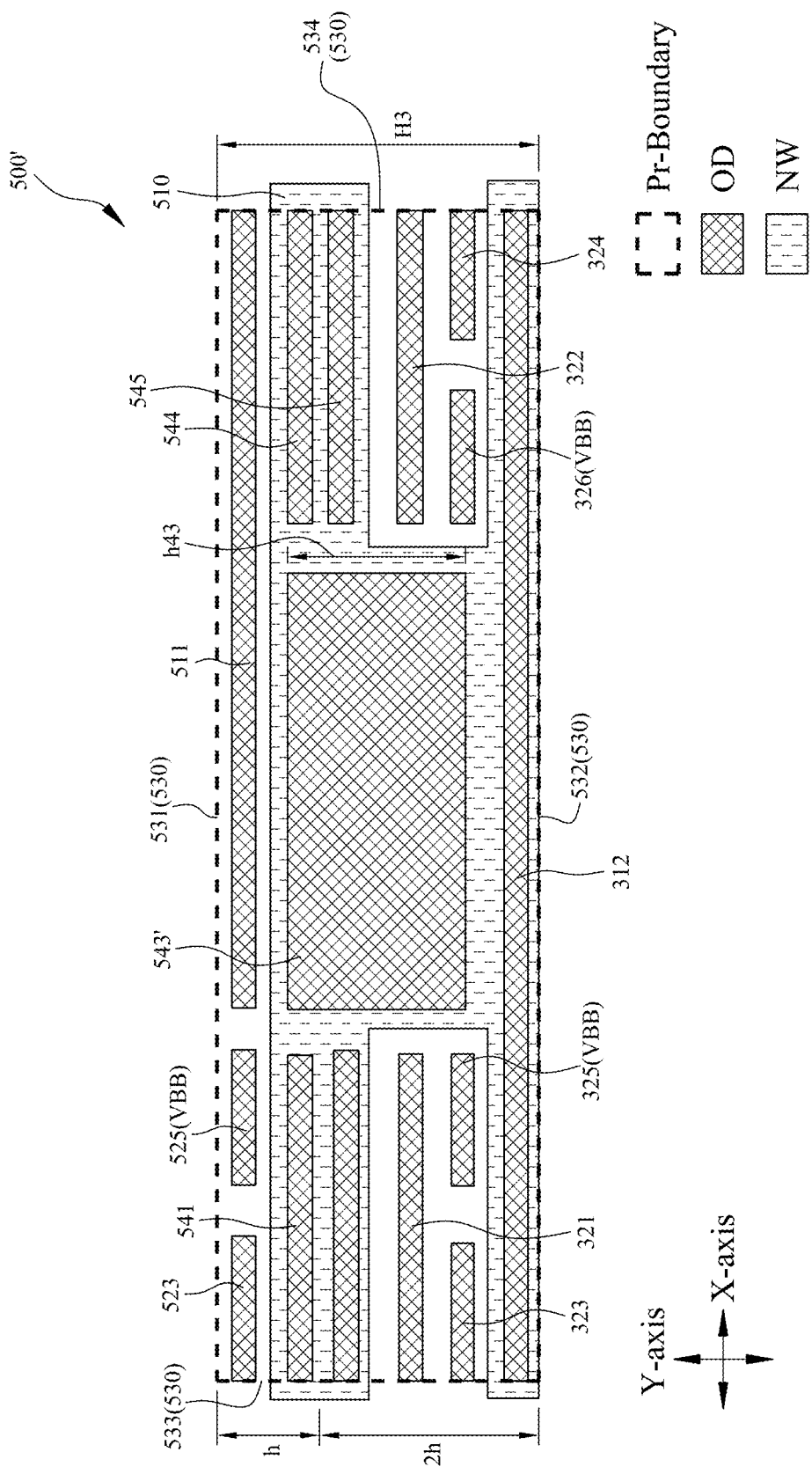

FIG. 5C is a schematic view of various layers in a layout diagram of an antenna cell 500', in accordance with some embodiments. In some embodiments, the antenna cell 500' corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 500' are included in functional circuits to provide antenna effect protection inside the functional circuits, as described herein. In at least one embodiment, the layout diagram of the antenna cell 500' is stored as a standard cell in a standard cell library on a non-transitory computer-readable medium.

The antenna cell 500' is similar to the antenna cell 500, except that the PMOS active regions 313, 543 in the antenna cell 500 are merged into a single PMOS active region 543' having a width h43 in the antenna cell 500'. In at least one embodiment, one or more advantages described herein are achievable by the antenna cell 500', and/or by an IC device including the antenna cell 500'.

Figure 6A:
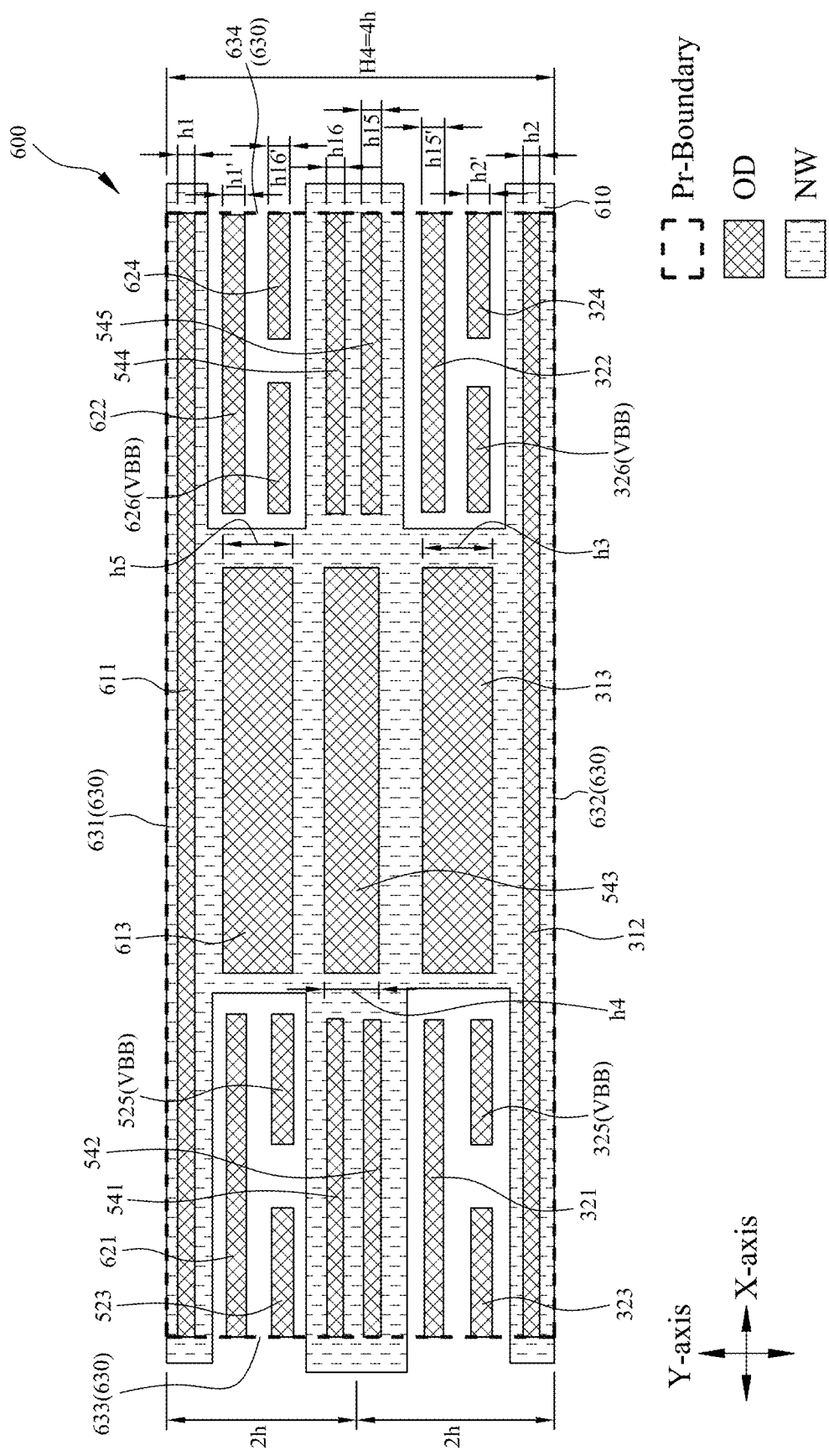
Figure 6B:
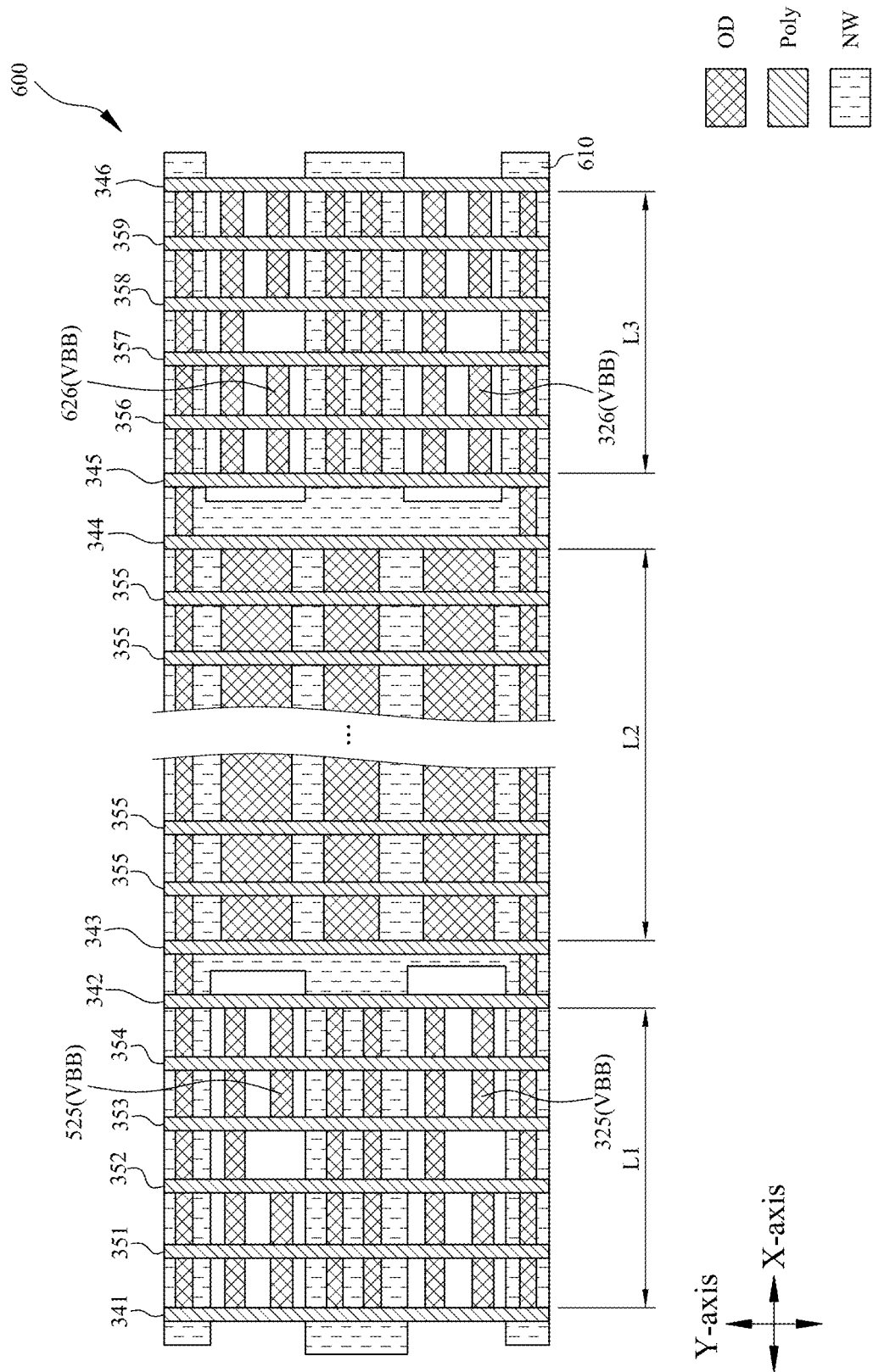

FIGS. 6A-6B are schematic views of various layers in a layout diagram of an antenna cell 600, in accordance with some embodiments. In some embodiments, the antenna cell 600 corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 600 are included in functional circuits to provide antenna effect protection inside the functional circuits, as described herein. In at least one embodiment, the layout diagram of the antenna cell 600 is stored as a standard cell in a standard cell library on a non-transitory computer-readable medium. Components in FIGS. 6A-6B having corresponding components in FIGS. 3A-3B, 5A-5B are designated by the same reference numerals of FIGS. 3A-3B, 5A-5B.

A difference between the antenna cell 500 and the antenna cell 600 is that the antenna cell 600 has a quadruple height of H4 or 4h.

In FIG. 6A, the antenna cell 600 comprises a boundary 630 with edges 631-634 corresponding to the boundary 330 and edges 331-334 of the antenna cell 300. The antenna cell 600 further comprises an N well 610 corresponding to the N well 310 of the antenna cell 300. The antenna cell 600 further comprises PMOS active regions 312, 313, 541-545, 611, 613, and NMOS active regions 321-326, 523, 525, 621, 622, 624, 626. The NMOS active regions 325, 326, 525, 626 are configured to receive the reference voltage VBB. In some embodiments, the widths h1, h1', h2, h2', h15, h15', h16, h16' of the active regions along the edges 633, 634 of the boundary 630 are equal to the widths of active regions in cells or functional circuits to be protected, to facilitate cell placement and/or abutment. The PMOS active regions 313, 543, 613 have corresponding increased widths h3, h4, h5 that contribute to an increased chip area efficiency. The PMOS active regions 313, 543, 613 are spaced from each other along the Y-axis. Other configurations are within the scopes of various embodiments. For example, two or more of the PMOS active regions 313, 543, 613 are merged together in one or more embodiments. In the example configuration in FIG. 6A, each of the widths h1, h1', h2, h2', h15, h15', h16, h16' corresponds to 2 fins, the width h4 corresponds to 5 fins, and each of the widths h3 and h5 corresponds to 8 fins. Other configurations are within the scopes of various embodiments.

In FIG. 6B, the antenna cell 600 further comprises dummy gate regions 341-346 and functional gate regions 351-359 over the active regions. The functional gate regions 351-359 and the underlying active regions form a plurality of PMOS transistors and NMOS transistors which have gates, sources and drains electrically coupled together, and to a pin I (not shown) in a manner similar to the antenna cell 300. For simplicity, various interconnect structures, vias, conductive patterns are omitted in FIG. 6B. In at least one embodiment, one or more advantages described herein are achievable by the antenna cell 600, and/or by an IC device including the antenna cell 600.

The antenna cells described with respect to FIGS. 3A-3B, 5A-5C, 6A-6B are PMOS dominating antenna cells in which the number or area of PMOS transistors configured for antenna usage is greater than the number or area of NMOS transistors configured for antenna usage. In contrast, NMOS dominating antenna cells have a greater number or area of NMOS transistors configured for antenna usage than a number or area of PMOS transistors configured for antenna usage. Example NMOS dominating antenna cells are described with respect to FIGS. 7A-7B, 8A-8B, 9A-9B. N-type features, P-type features, NMOS active regions, PMOS active regions, NMOS transistors, PMOS transistors, N wells, regions of an N-type substrate and a reference voltage VPP in NMOS dominating antenna cells correspond to P-type features, N-type features, PMOS active regions, NMOS active regions, PMOS transistors, NMOS transistors, regions of a P-type substrate, P wells, and the reference voltage VBB in PMOS dominating antenna cells.

Figure 7A:
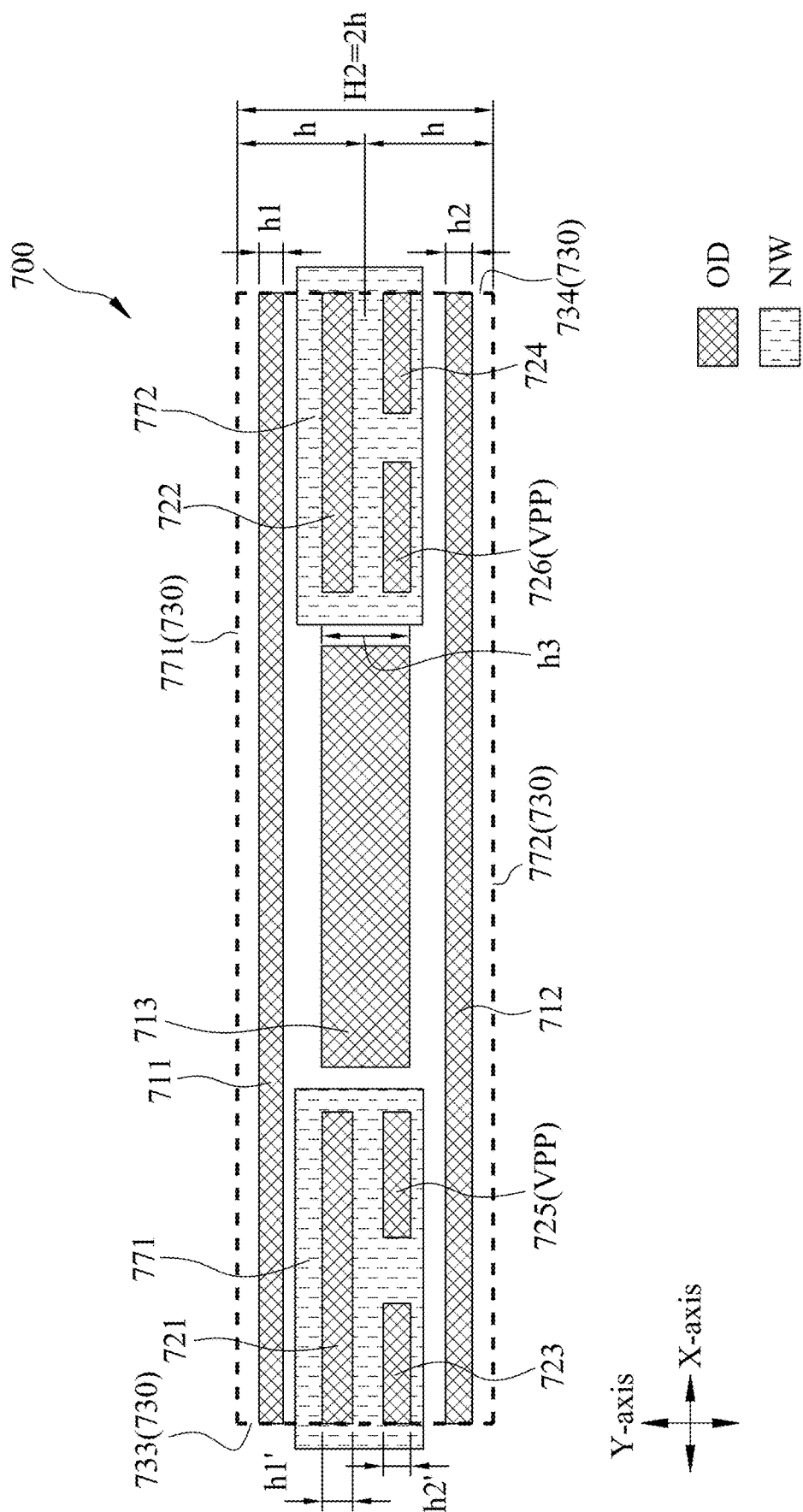
Figure 7B:
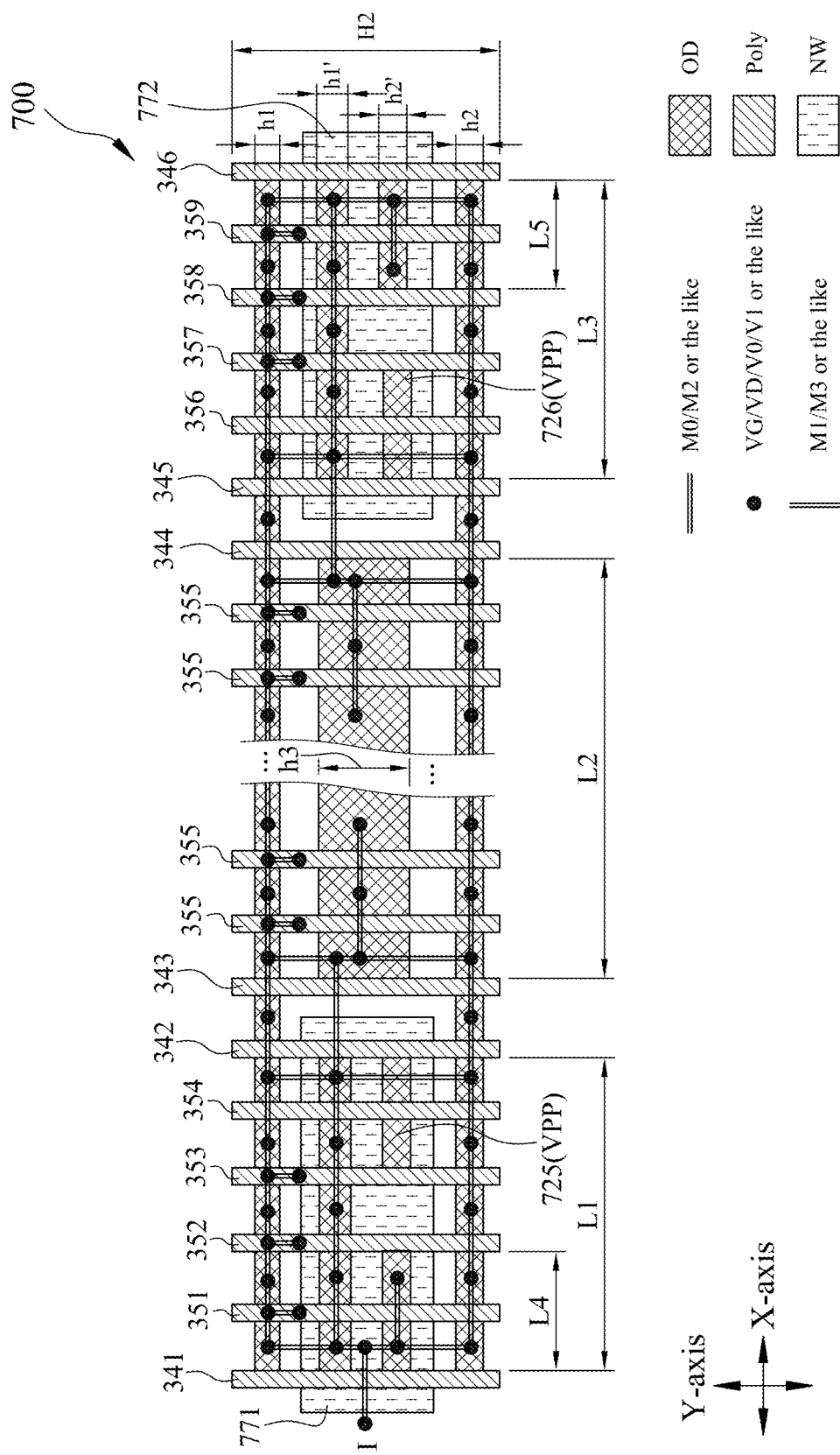

FIGS. 7A-7B are schematic views of various layers in a layout diagram of an antenna cell 700, in accordance with some embodiments. In some embodiments, the antenna cell 700 corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 700 are included in functional circuits to provide antenna effect protection inside the functional circuits, as described herein. In at least one embodiment, the layout diagram of the antenna cell 700 is stored as a standard cell in a standard cell library on a non-transitory computer-readable medium. Components in FIGS. 7A-7B having corresponding components in FIGS. 3A-3B are designated by the same reference numerals of FIGS. 3A-3B.

As noted herein, a difference between the antenna cell 300 and the antenna cell 700 is that the antenna cell 700 is an NMOS dominating antenna cell. Similarly to the antenna cell 300, the antenna cell 700 has a double height H2 or 2h.

In FIG. 7A, the antenna cell 700 comprises a boundary 730 with edges 731-734 corresponding to the boundary 330 and edges 331-334 of the antenna cell 300. The antenna cell 700 further comprises N wells 771, 772 corresponding to the sections 320 of the substrate of the antenna cell 300. The antenna cell 700 further comprises PMOS active regions 721-726 arranged in the N wells 771, 772, and NMOS active regions 711-713. The PMOS active regions 725, 726 are configured to receive the reference voltage VPP. In some embodiments, the reference voltage VPP is a bias voltage applied to the PMOS active regions 725, 726 to avoid substrate latch-up issues in a manner consistent with a standard cell structure when N wells are interrupted by a P-type substrate. In one or more embodiments, the reference voltage VPP is a power supply voltage. In at least one embodiment, the reference voltage VPP is a positive power supply voltage VDD. In some embodiments, one or more of the PMOS active regions 725, 726 are also configured for antenna usage.

In some embodiments, the widths h1, h1', h2, h2' of the active regions along the edges 733, 734 of the boundary 730 are equal to the widths of active regions in cells or functional circuits to be protected, to facilitate cell placement and/or abutment. The NMOS active region 713 has an increased width h3 that contributes to an increased chip area efficiency. In the example configuration in FIG. 7A, each of the widths h1, h1', h2, h2' corresponds to 2 fins, and the width h3 corresponds to 8 fins. Other configurations are within the scopes of various embodiments.

In FIG. 7B, the antenna cell 700 further comprises dummy gate regions 341-346 and functional gate regions 351-359 over the active regions. The functional gate regions 351-359 and the underlying active regions form a plurality of PMOS transistors and NMOS transistors which have gates, sources and drains electrically coupled together, and to a pin I in a manner similar to the antenna cell 300. In at least one embodiment, one or more advantages described herein are achievable by the antenna cell 700, and/or by an IC device including the antenna cell 700.

Figure 8A:
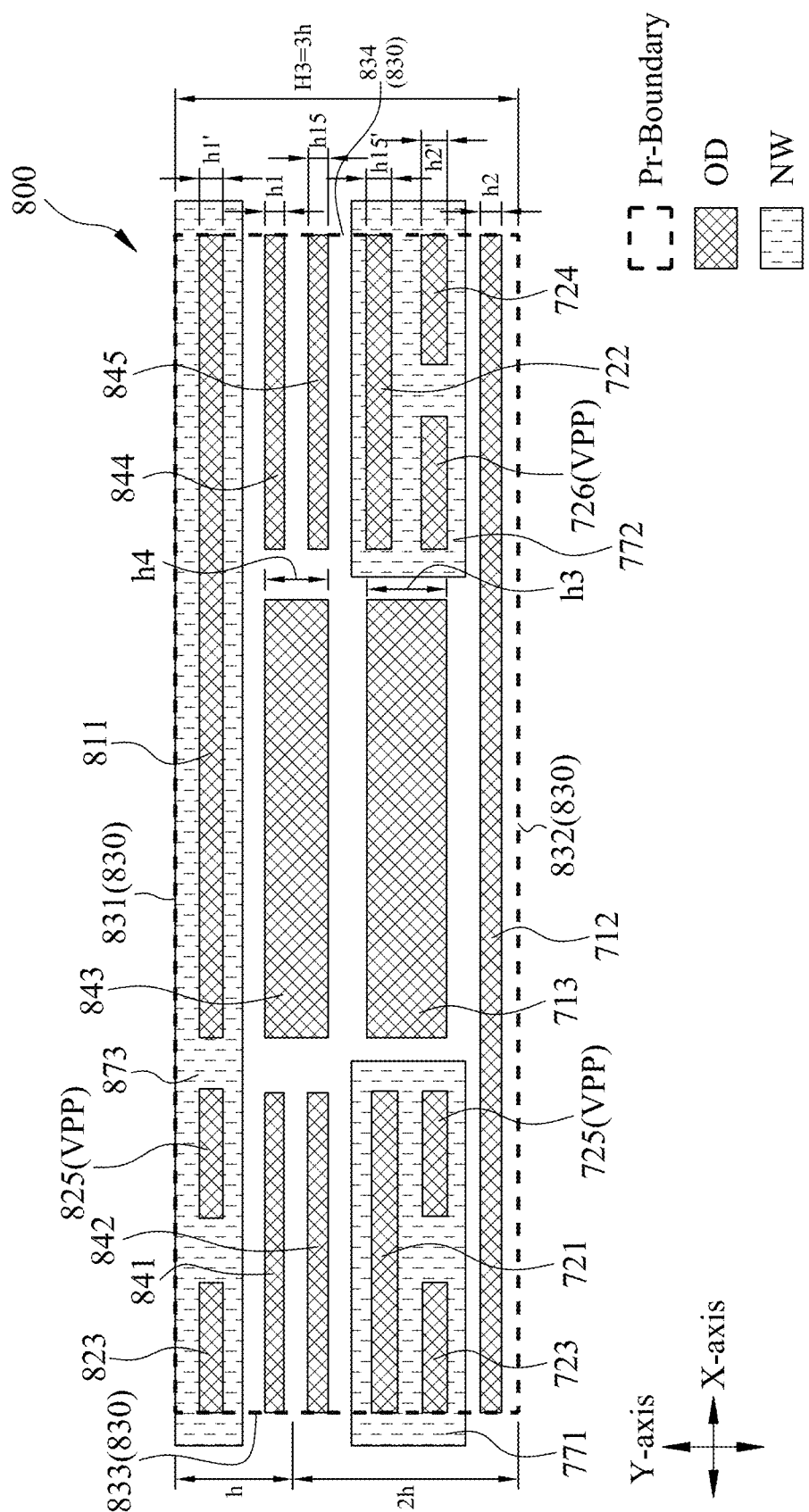
Figure 8B:
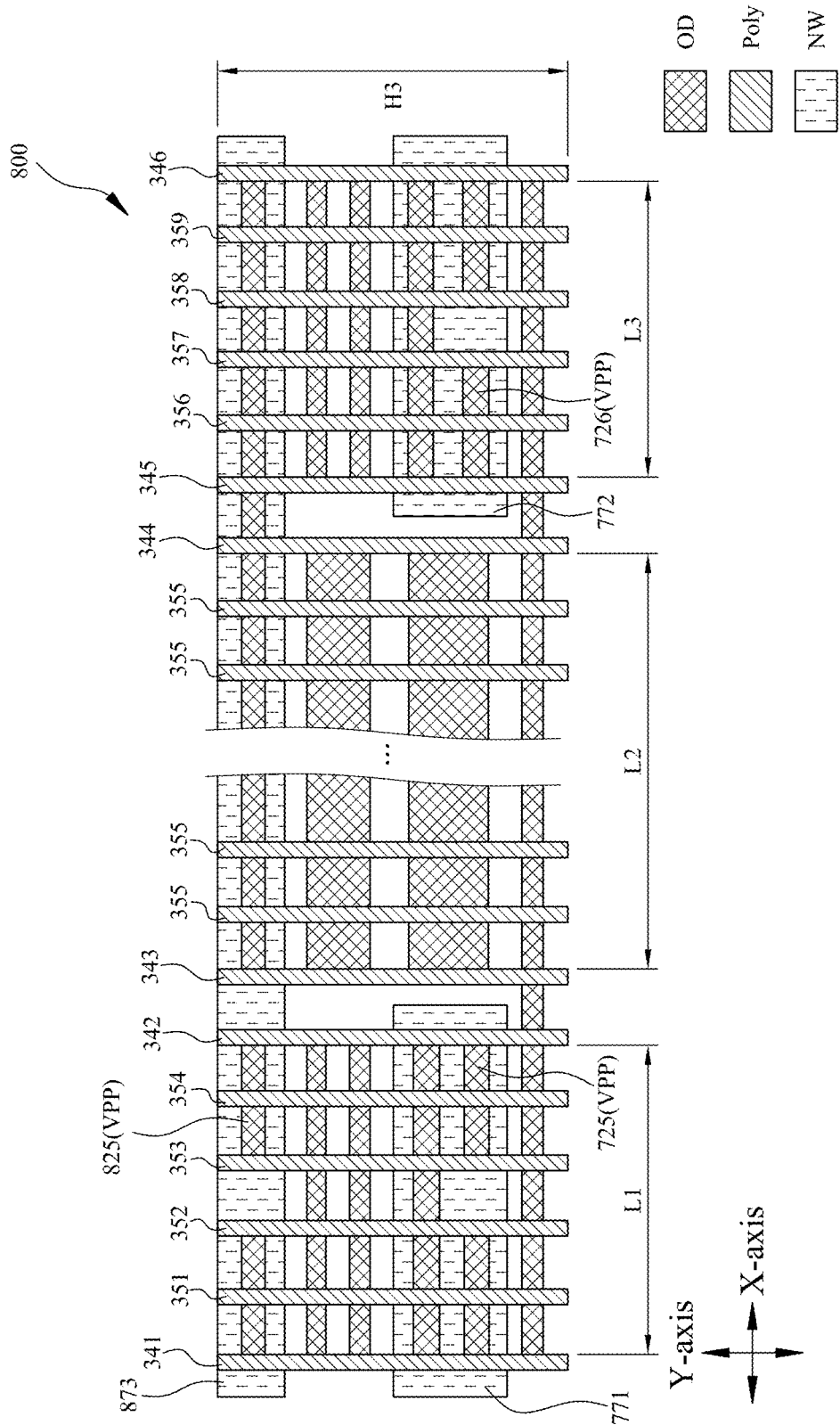

FIGS. 8A-8B are schematic views of various layers in a layout diagram of an antenna cell 800, in accordance with some embodiments. In some embodiments, the antenna cell 800 corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 800 are included in functional circuits to provide antenna effect protection inside the functional circuits, as described herein. In at least one embodiment, the layout diagram of the antenna cell 800 is stored as a standard cell in a standard cell library on a non-transitory computer-readable medium. Components in FIGS. 8A-8B having corresponding components in FIGS. 7A-7B are designated by the same reference numerals of FIGS. 7A-7B.

A difference between the antenna cell 700 and the antenna cell 800 is that the antenna cell 800 has a triple height of H3 or 3h.

In FIG. 8A, the antenna cell 800 comprises a boundary 830 with edges 831-834 corresponding to the boundary 730 and edges 731-734 of the antenna cell 700. The antenna cell 800 further comprises an N well 873. The antenna cell 800 further comprises NMOS active regions 712, 713, 841-845, and PMOS active regions 721-726, 823, 825, 811. The PMOS active regions 725, 726, 825 are configured to receive the reference voltage VPP. In some embodiments, the widths h1, h1', h2, h2', h15, h15' of the active regions along the edges 833, 834 of the boundary 830 are equal to the widths of active regions in cells or functional circuits to be protected, to facilitate cell placement and/or abutment. The NMOS active regions 713, 843 have corresponding increased widths h3, h4 that contribute to an increased chip area efficiency. The NMOS active regions 713, 843 are spaced from each other along the Y-axis. Other configurations are within the scopes of various embodiments. For example, the NMOS active regions 713, 843 are merged into a single NMOS active region in at least one embodiment. In the example configuration in FIG. 8A, each of the widths h1, h1', h2, h2', h15, h15' corresponds to 2 fins, the width h4 corresponds to 5 fins, and the width h3 corresponds to 8 fins. Other configurations are within the scopes of various embodiments.

In FIG. 8B, the antenna cell 800 further comprises dummy gate regions 341-346 and functional gate regions 351-359 over the active regions. The functional gate regions 351-359 and the underlying active regions form a plurality of PMOS transistors and NMOS transistors which have gates, sources and drains electrically coupled together, and to a pin I (not shown) in a manner similar to the antenna cell 700 or antenna cell 300. For simplicity, various interconnect structures, vias, conductive patterns are omitted in FIG. 8B. In at least one embodiment, one or more advantages described herein are achievable by the antenna cell 800, and/or by an IC device including the antenna cell 800.

Figure 9A:
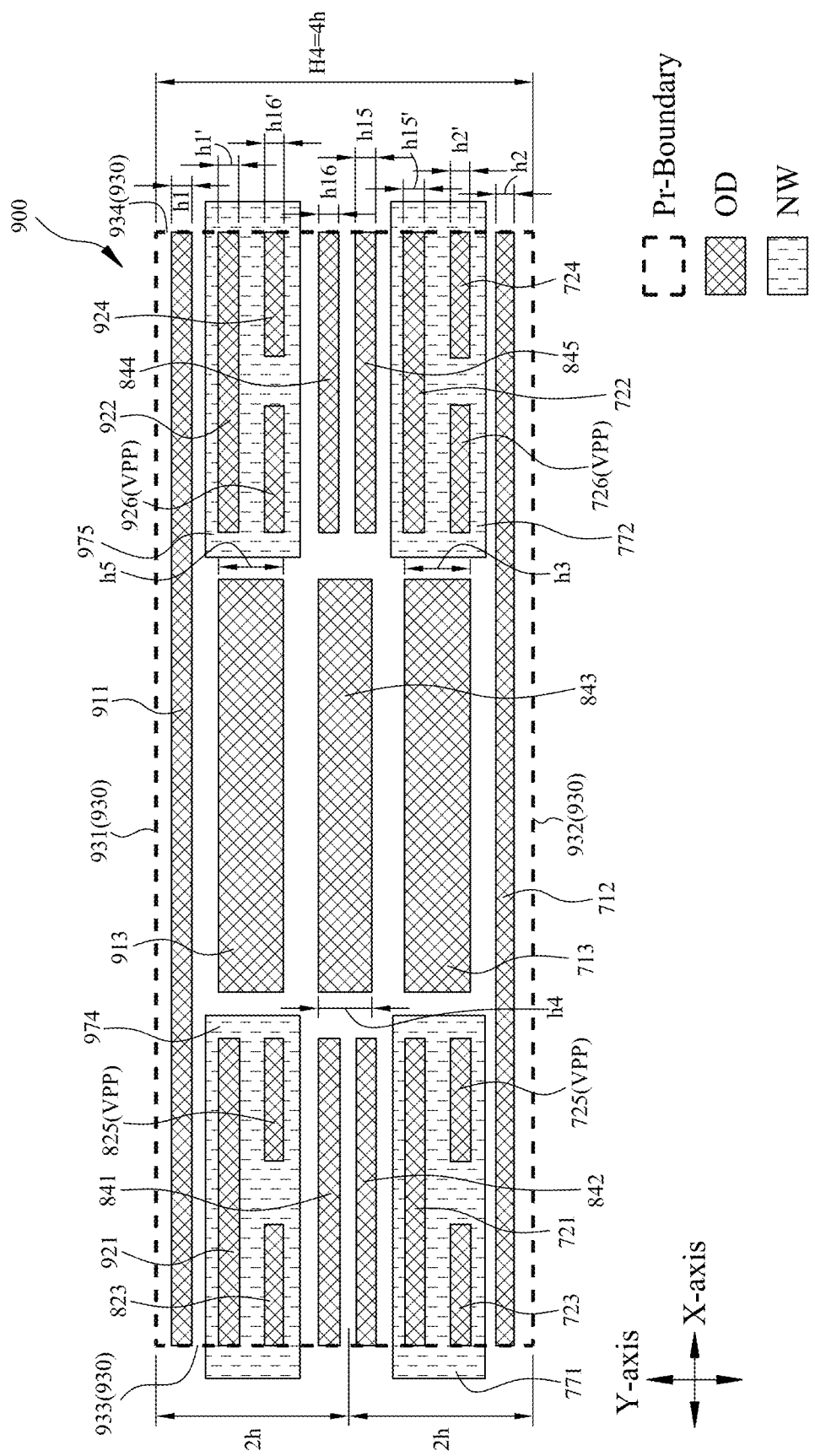
Figure 9B:
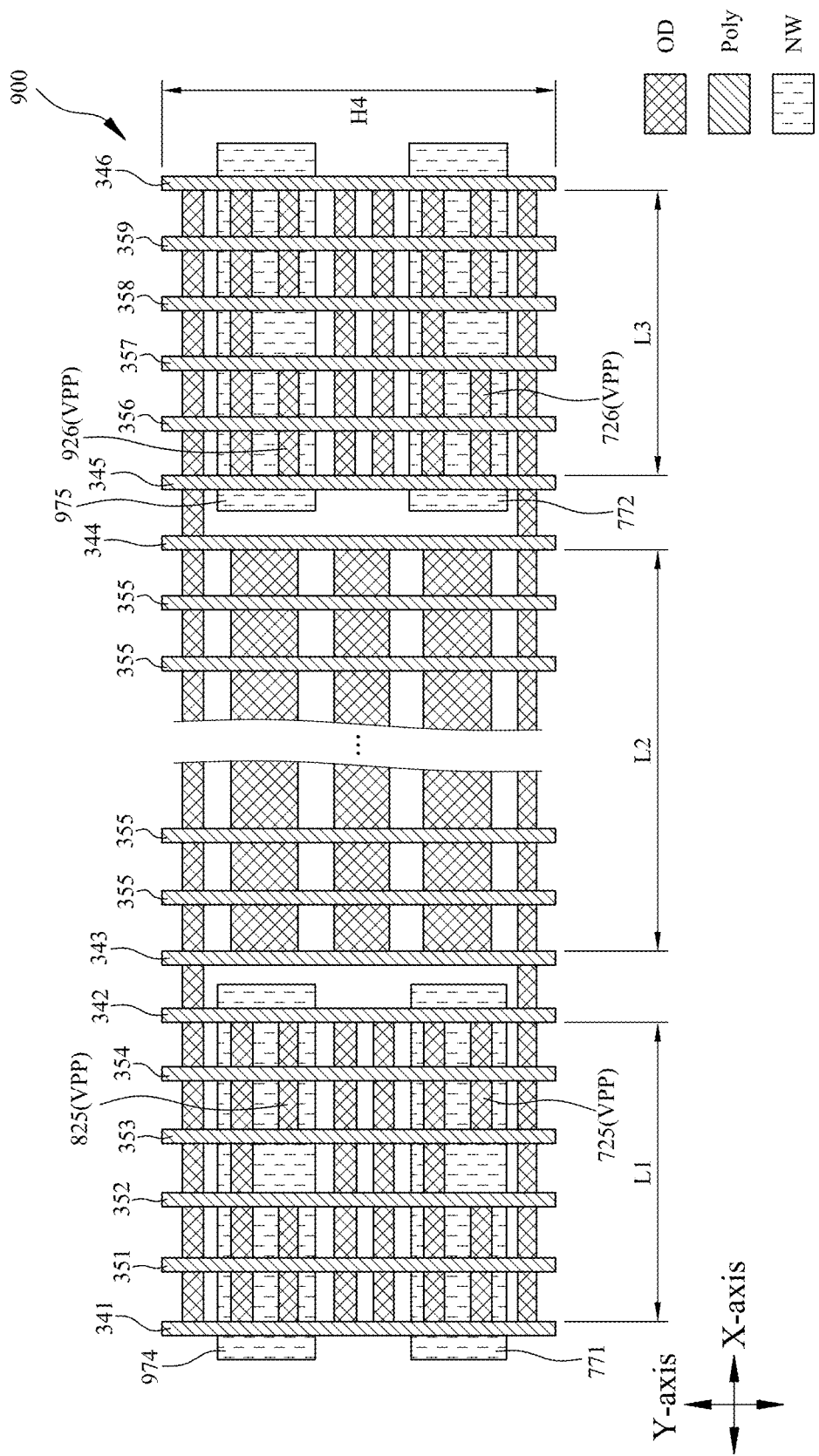

FIGS. 9A-9B are schematic views of various layers in a layout diagram of an antenna cell 900, in accordance with some embodiments. In some embodiments, the antenna cell 900 corresponds to any of the antenna effect protection circuits ANT-I, ANT-E, 200, or corresponds to a part of any of the antenna effect protection circuits ANT-I, ANT-E, 200 that comprises multiple antenna cells. In some embodiments, one or more of antenna cells 900 are included in functional circuits to provide antenna effect protection inside the functional circuits, as described herein. In at least one embodiment, the layout diagram of the antenna cell 900 is stored as a standard cell in a standard cell library on a non-transitory computer-readable medium. Components in FIGS. 9A-9B having corresponding components in FIGS. 7A-7B, 8A-8B are designated by the same reference numerals of 7A-7B, 8A-8B.

A difference between the antenna cell 800 and the antenna cell 900 is that the antenna cell 900 has a quadruple height of H4 or 4h.

In FIG. 9A, the antenna cell 900 comprises a boundary 930 with edges 931-934 corresponding to the boundary 730 and edges 731-734 of the antenna cell 700. The antenna cell 900 further comprises N wells 974, 975. The antenna cell 900 further comprises NMOS active regions 712, 713, 841-845, 911, 913, and PMOS active regions 721-726, 823, 825, 921, 922, 924, 926. The PMOS active regions 725, 726, 825, 926 are configured to receive the reference voltage VPP. In some embodiments, the widths h1, h1', h2, h2', h15, h15', h16, h16' of the active regions along the edges 933, 934 of the boundary 930 are equal to the widths of active regions in cells or functional circuits to be protected, to facilitate cell placement and/or abutment. The NMOS active regions 713, 843, 913 have corresponding increased widths h3, h4, h5 that contribute to an increased chip area efficiency. The NMOS active regions 713, 843, 913 are spaced from each other along the Y-axis. Other configurations are within the scopes of various embodiments. For example, two or more of the NMOS active regions 713, 843, 913 are merged together in one or more embodiments. In the example configuration in FIG. 9A, each of the widths h1, h1', h2, h2', h15, h15', h16, h16' corresponds to 2 fins, the width h4 corresponds to 5 fins, and each of the widths h3 and h5 corresponds to 8 fins. Other configurations are within the scopes of various embodiments.

In FIG. 9B, the antenna cell 900 further comprises dummy gate regions 341-346 and functional gate regions 351-359 over the active regions. The functional gate regions 351-359 and the underlying active regions form a plurality of PMOS transistors and NMOS transistors which have gates, sources and drains electrically coupled together, and to a pin I (not shown) in a manner similar to the antenna cell 300 and/or antenna cell 700. For simplicity, various interconnect structures, vias, conductive patterns are omitted in FIG. 9B. In at least one embodiment, one or more advantages described herein are achievable by the antenna cell 900, and/or by an IC device including the antenna cell 900.

Figure 10A:
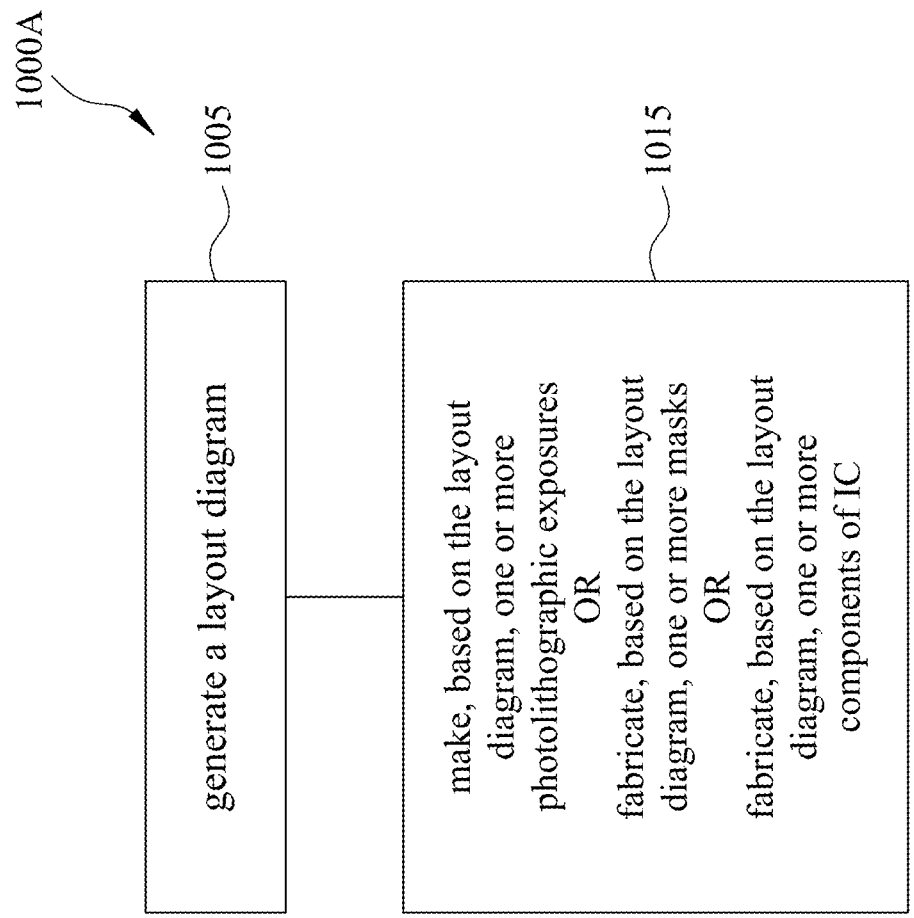
FIGS. 10A-10B are flowcharts of various methods, in accordance with some embodiments.

FIG. 10A is a flowchart of a method 1000A of generating a layout diagram and using the layout diagram to manufacture an IC device, in accordance with some embodiments.

Method 1000A is implementable, for example, using EDA system 1100 (FIG. 11, discussed below) and an integrated circuit (IC) manufacturing system 1200 (FIG. 12, discussed below), in accordance with some embodiments. Regarding method 1000A, examples of the layout diagram include the layout diagrams disclosed herein, or the like. Examples of an IC device to be manufactured according to method 1000A include the IC devices 100, 400. In FIG. 10A, method 1000A includes blocks 1005, 1015.

At block 1005, a layout diagram is generated which, among other things, include patterns represent one or more circuit regions, circuitry, circuits or cells as described with respect to FIGS. 3A-3B, 5A-5C, 6A-6B, 7A-7B, 8A-8B, 9A-9B, or the like. An example of an IC device corresponding to a layout diagram generated by block 1005 includes IC devices 100, 400.

At block 1015, based on the layout diagram, at least one of (A) one or more photolithographic exposures are made or (b) one or more semiconductor masks are fabricated or (C) one or more components in a layer of an IC device are fabricated.

Figure 10B:
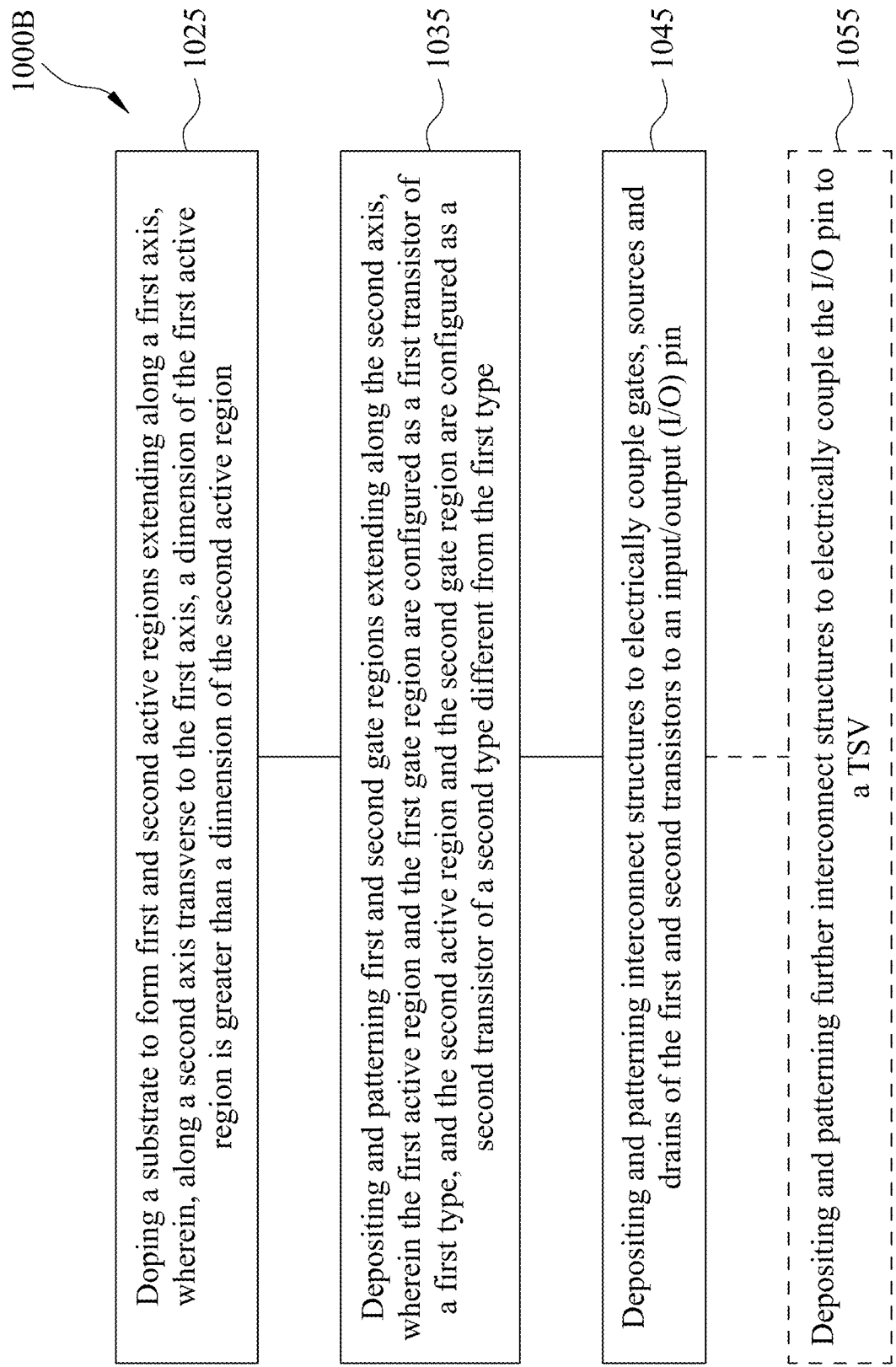

FIG. 10B is a flowchart of a method 1000B of manufacturing an IC device, in accordance with some embodiments. More particularly, the flowchart of FIG. 10B shows additional blocks that demonstrate one example of procedures implementable in block 1015 of FIG. 10A, in accordance with one or more embodiments. In FIG. 10B, block 1015 includes blocks 1025, 1035, 1045, 1055.

At block 1025, a substrate is doped to form first and second active regions extending along a first axis, wherein, along a second axis transverse to the first axis, a dimension of the first active region is greater than a dimension of the second active region. For example, as described with respect to FIG. 3A, a first active region 313 and a second active region 321 are formed in or over a substrate to extend along the X-axis which is a first axis. Along the Y-axis, which is a second axis, a dimension or height h3 of the active region 313 is greater than a dimension or height h1' of the active region 321.

An example manufacturing process starts from a substrate, such as the substrate 420 described with respect to FIGS. 4A-4B. The substrate comprises, in at least one embodiment, silicon, silicon germanium (SiGe), gallium arsenic, or other suitable semiconductor materials. Active regions are formed in or over the substrate, using one or more masks corresponding to one or more active regions in the layout diagrams described herein.

At block 1035, first and second gate regions are deposited and patterned over the active regions to extend along the second axis, wherein the first active region and the first gate region are configured as a first transistor of a first type, and the second active region and the second gate region are configured as a second transistor of a second type different from the first type. For example, as described with respect to FIG. 3B, a first gate region 355 is deposited and patterned over the first active region 313 to form a PMOS transistor which is a first transistor of a first type, and a second gate region 351-354 is deposited and patterned over the second active region 321 to form an NMOS transistor which is a second transistor of a second type.

In an example manufacturing process, a gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, such as the gate dielectric layers 435, 436, and the gate electrode layer is patterned into one or more gate electrodes, such as the gate electrode 455 described with respect to FIG. 4A. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or $BF_2$, n-type dopants, such as phosphorus or arsenic, and/or combinations thereof.

At block 1045, interconnect structures are deposited and patterned to electrically couple gates, sources and drains of the first and second transistors to an input/output (I/O) pin. For example, as described with respect to FIGS. 3B, 4A, 4B, various MD contact structures, VD via structures, VG via structures, M0 conductive patterns, V0 via structures, M1 conductive patterns, V1 via structures, or the like, are formed over the PMOS and NMOS transistors to electrically couple the gates, sources and drains of the PMOS and NMOS transistors to each other and to a pin I. As a result, an antenna effect protection circuit having an equivalent circuit as described with respect to FIG. 2 is obtained.

In an example manufacturing process, a conductive layer, e.g., a metal, is deposited over the substrate with the transistors formed thereon, thereby making electrical connections to the drain/source regions of the transistors. A planarizing process is performed to planarize the conductive layer, resulting in contact structures, such as the MD contact structures described with respect to FIG. 4B, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more via structures, such as the VD and VG via structures described with respect to FIGS. 4A-4B. A planarizing process is performed. An M0 layer including a conductive material, such as a metal, is deposited over the planarized structure and patterned to form various M0 conductive patterns, such as the M0 conductive patterns described with respect to FIGS. 4A-4B. A dielectric layer is deposited over the patterned M0 layer. The dielectric layer is etched, and the etched portions are filled with a conductive material, such as a metal, to form one or more via structures in a V0 layer, for example, as described with respect to FIGS. 4A-4B. A planarizing process is then performed. An M1 layer including a conductive material, such as a metal, is deposited over the planarized structure obtained at the end of the formation of the V0 layer. The M1 layer is patterned to form various M1 conductive patterns, for example, as described with respect to FIGS. 4A-4B. The process is repeated until the pin I, which is an I/O pin, is electrically coupled to the gates, sources and drains of the PMOS and NMOS transistors. The obtained structure is an antenna effect protection circuit configured to protect gate dielectric materials in functional circuits from being damaged due to the antenna effect, while achieving one or more advantages described herein, including, but not limited to, improved chip area efficiency, reduced routing effort, or the like.

At block 1055, further interconnect structures are deposited and patterned to electrically couple the I/O pin to a TSV. For example, as described with respect to FIGS. 4A-4B, one or more conductive patterns and/or one or more via structures are formed as parts of the interconnect structure 480 to electrically couple the pin I, which is an I/O pin, to the TSV 481. Example manufacturing processes for forming the TSV 481 and/or for manufacturing a 3D IC including the TSV 481 are described with respect to FIGS. 4A-4B. In some embodiments where the antenna effect protection circuit obtained at block 1045 is configured to fix antenna issues and/or to satisfy antenna design rules associated with a structure other than a TSV, block 1055 is omitted.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EAD system is usable as part of a design house of an IC manufacturing system discussed below.

Figure 11:
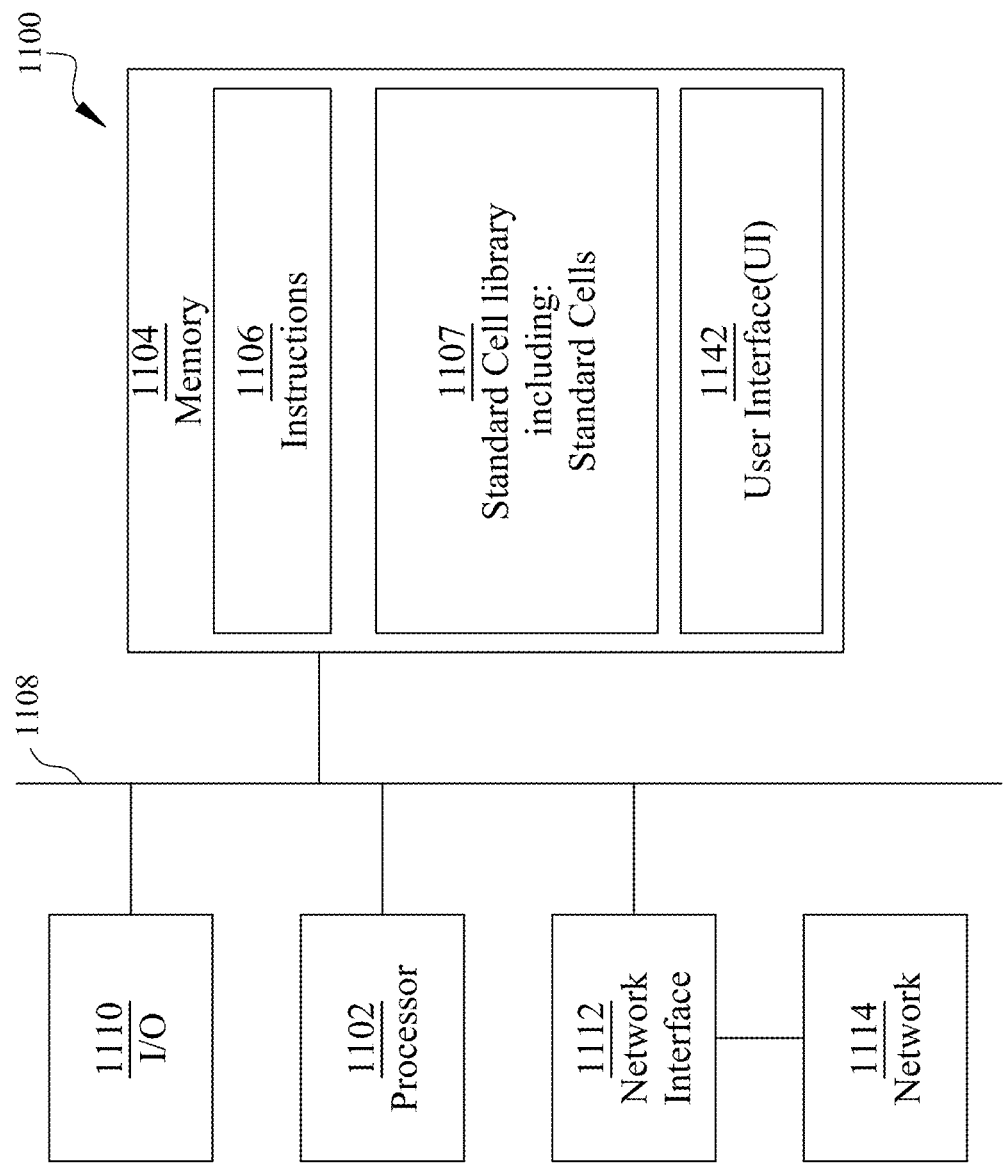
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 includes an APR system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
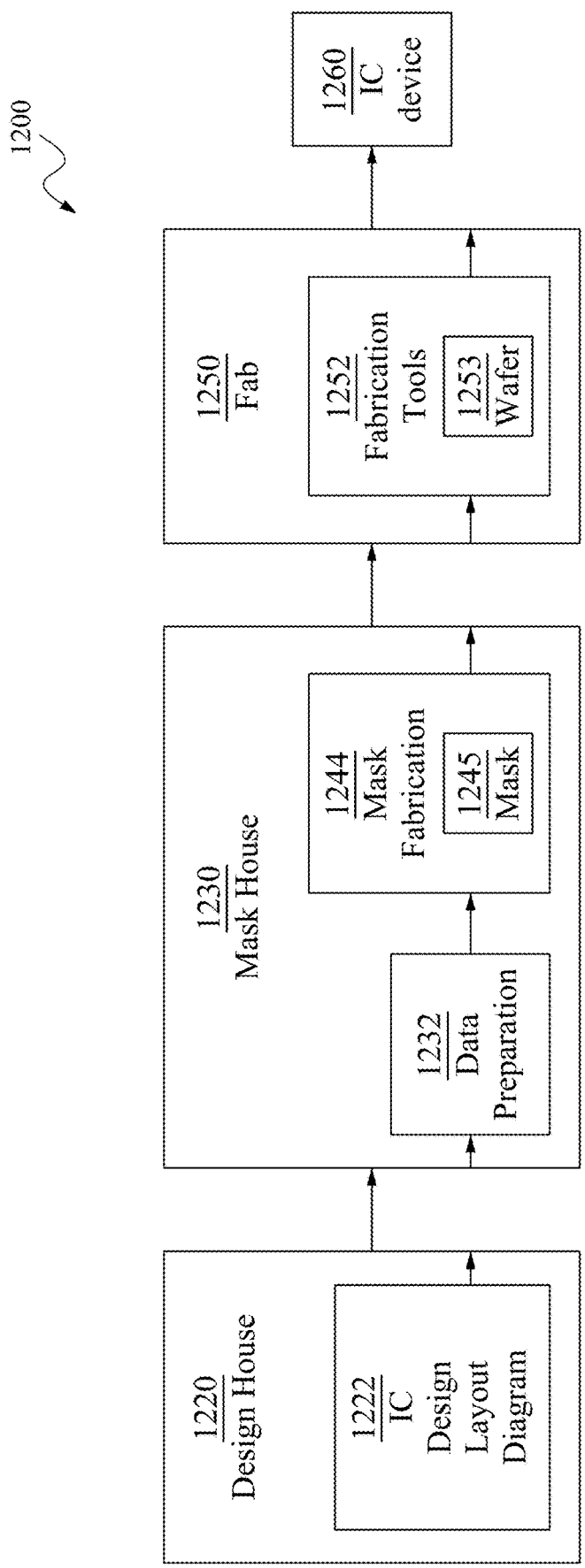
FIG. 12 is a block diagram of an IC device manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place-and-route operation. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, an integrated circuit (IC) device comprises a first substrate, a through substrate via (TSV) in the first substrate, and a first antenna effect protection circuit over the first substrate and electrically coupled to the TSV. The first antenna effect protection circuit comprises at least one first transistor of a first type, and at least one second transistor of a second type different from the first type. A gate terminal, a first terminal and a second terminal of each of the at least one first transistor and the at least one second transistor are electrically coupled together, and to the TSV.

In an embodiment, an integrated circuit (IC) device comprises a plurality of active regions extending along a first axis, and a plurality of gate regions extending along a second axis transverse to the first axis. The plurality of active regions and the plurality of gate regions are configured as a plurality of transistors. Gates, sources and drains of the plurality of transistors are electrically coupled together. The plurality of active regions comprises a first active region of a first semiconductor type, and second and third active regions of a second semiconductor type different from the first semiconductor type. The second and third active regions are spaced from each other along the second axis, and overlap the first active region along the first axis.

In a method of manufacturing an integrated circuit (IC) device in accordance with an embodiment, first and second active regions extending along a first axis are formed over a first substrate. First and second gate regions are deposited and patterned over the first and second active regions, and extend along a second axis transverse to the first axis. The first active region and the first gate region are configured as a first transistor of a first type. The second active region and the second gate region are configured as a second transistor of a second type different from the first type. Interconnect structures are deposited and patterned to electrically couple gates, sources and drains of the first and second transistors to an input/output (I/O) pin. Along the second axis, a dimension of the first active region is greater than a dimension of the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a first substrate;
a through substrate via (TSV) in the first substrate; and
a first antenna effect protection circuit over the first substrate and electrically coupled to the TSV,
wherein
the first antenna effect protection circuit comprises at least one first transistor of a first type, and at least one second transistor of a second type different from the first type, and
a gate terminal, a first terminal and a second terminal of each of the at least one first transistor and the at least one second transistor are electrically coupled together, and to the TSV.

2. The IC device of claim 1, wherein
the at least one first transistor comprises multiple first transistors,
the at least one second transistor comprises multiple second transistors, and
in the first antenna effect protection circuit, a number of the first transistors is greater than a number of the second transistors.

3. The IC device of claim 2, wherein
the first transistors are N-type transistors, and
the second transistors are P-type transistors.

4. The IC device of claim 2, wherein
the first transistors are P-type transistors, and
the second transistors are N-type transistors.

5. The IC device of claim 1, further comprising:
a second substrate, wherein the first and second substrates are stacked one over another and bonded together; and
a second antenna effect protection circuit over the second substrate, wherein the first and second antenna effect protection circuits are electrically coupled correspondingly to first and second ends of the TSV.

6. The IC device of claim 5, wherein
the second antenna effect protection circuit comprises at least one third transistor of the first type, and at least one fourth transistor of the second type, and
a gate terminal, a first terminal and a second terminal of each of the at least one third transistor and the at least one fourth transistor are electrically coupled together, and to the second end of the TSV.

7. An integrated circuit (IC) device, comprising:
a plurality of active regions extending along a first axis; and
a plurality of gate regions extending along a second axis transverse to the first axis,
wherein
the plurality of active regions and the plurality of gate regions are configured as a plurality of transistors,
gates, sources and drains of the plurality of transistors are electrically coupled together,
the plurality of active regions comprises:
a first active region of a first semiconductor type, and
second and third active regions of a second semiconductor type different from the first semiconductor type, and
the second and third active regions are spaced from each other along the second axis, and overlap the first active region along the first axis.

8. The IC device of claim 7, wherein
the plurality of transistors comprises:
first transistors of a first type over the first active region, and second transistors of a second type over the second and third active regions, the second type different from the first type.

9. The IC device of claim 7, wherein
the third active region comprises discrete portions spaced from each other along the first axis, and
at least one of the discrete portions of the third active region is configured to receive a reference voltage.

10. The IC device of claim 7, wherein
the plurality of active regions further comprises fourth and fifth active regions of the first semiconductor type,
along the second axis, the first through third active regions are arranged between the fourth and fifth active regions, and
each of the fourth and fifth active regions extends continuously along the first axis and overlaps, along the second axis, the first through third active regions.

11. The IC device of claim 7, wherein
the plurality of active regions further comprises fourth and fifth active regions of the second semiconductor type,
the fourth and fifth active regions are spaced from each other along the second axis, and overlap the first active region along the first axis, and
along the first axis, the second and third active regions are on one side of the first active region, and the fourth and fifth active regions are on an opposite side of the first active region.

12. The IC device of claim 11, wherein
the plurality of active regions further comprises sixth and seventh active regions of the first semiconductor type,
along the second axis, the first through fifth active regions are arranged between the sixth and seventh active regions, and
each of the sixth and seventh active regions extends continuously along the first axis and overlaps, along the second axis, the first through fifth active regions.

13. The IC device of claim 12, further comprising:
an H-shaped or I-shaped doped well region over which the first, sixth and seventh active regions are arranged.

14. The IC device of claim 7, wherein
the plurality of active regions further comprises fourth and fifth active regions of the first semiconductor type,
the fourth and fifth active regions are spaced from each other along the second axis,
the fourth and fifth active regions are spaced from and overlap the second and third active regions along the second axis, and
along the second axis, the fourth and fifth active regions overlap
the first active region, or
a sixth active region among the plurality of active regions, wherein the sixth active region is spaced from and overlaps the first active region along the second axis.

15. The IC device of claim 14, wherein
the plurality of active regions further comprises a seventh active region of the first semiconductor type, and an eighth active region of the second semiconductor type,
along the second axis, the first through fifth active regions are arranged between the seventh and eighth active regions, and
each of the seventh and eighth active regions extends continuously along the first axis and overlaps, along the second axis, the first through fifth active regions.

16. The IC device of claim 14, wherein
the plurality of active regions further comprises seventh and eighth active regions of the second semiconductor type,
the seventh and eighth active regions are spaced from each other along the second axis,
the seventh and eighth active regions are spaced from and overlap the second through fifth active regions along the second axis, and
along the second axis, the seventh and eighth active regions overlap
the first active region, or
the sixth active region, or
a ninth active region wherein the ninth active region is spaced from and overlaps the first active region along the second axis.

17. The IC device of claim 16, wherein
the plurality of active regions further comprises tenth and eleventh active regions of the first semiconductor type,
along the second axis, the first through fifth, seventh and eighth active regions are arranged between the tenth and eleventh active regions, and
each of the tenth and eleventh active regions extends continuously along the first axis and overlaps, along the second axis, the first through fifth, seventh and eighth active regions.

18. A method of manufacturing an integrated circuit (IC) device, the method comprising:
forming, over a first substrate, first and second active regions extending along a first axis;
depositing and patterning, over the first and second active regions, first and second gate regions extending along a second axis transverse to the first axis, wherein
the first active region and the first gate region are configured as a first transistor of a first type, and
the second active region and the second gate region are configured as a second transistor of a second type different from the first type; and
depositing and patterning interconnect structures to electrically couple gates, sources and drains of the first and second transistors to an input/output (I/O) pin,
wherein, along the second axis, a dimension of the first active region is greater than a dimension of the second active region.

19. The method of claim 18, further comprising:
etching and depositing a conductive material to form a through substrate via (TSV) in the first substrate; and
depositing and patterning at least one further interconnect structure to electrically couple the TSV to the I/O pin.

20. The method of claim 19, wherein the I/O pin is electrically coupled to a first end of the TSV, said method further comprising:
stacking the first substrate and a second substrate one over another, and bonding the stacked first and second substrates together; and
electrically coupling the second substrate to a second end of the TSV.

* * * * *